(12) United States Patent
Cheon et al.

(10) Patent No.: US 12,219,763 B2
(45) Date of Patent: Feb. 4, 2025

(54) INTEGRATED CIRCUIT DEVICE

(71) Applicant: SAMSUNG ELECTRONICS CO., LTD., Suwon-si (KR)

(72) Inventors: Jisung Cheon, Ansan-si (KR); Byunggon Park, Seoul (KR); Joowon Park, Seoul (KR); Sangjun Hong, Hwaseong-si (KR); Jinsoo Lim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 344 days.

(21) Appl. No.: 17/744,092

(22) Filed: May 13, 2022

(65) Prior Publication Data

US 2022/0271056 A1   Aug. 25, 2022

Related U.S. Application Data

(63) Continuation of application No. 16/710,402, filed on Dec. 11, 2019, now Pat. No. 11,335,695.

(30) Foreign Application Priority Data

Jun. 28, 2019  (KR) .................. 10-2019-0078340

(51) Int. Cl.
*H10B 43/27*   (2023.01)
*H01L 21/28*   (2006.01)
(Continued)

(52) U.S. Cl.
CPC ....... *H10B 43/27* (2023.02); *H01L 21/76805* (2013.01); *H01L 21/76816* (2013.01);
(Continued)

(58) Field of Classification Search
CPC .............................. H10B 43/27; H10B 43/20
See application file for complete search history.

(56) References Cited

U.S. PATENT DOCUMENTS 9,627,403 B2   4/2017  Liu et al.
9,728,551 B1   8/2017  Lu et al.
(Continued)

FOREIGN PATENT DOCUMENTS

KR   10-2018-0096878 A   8/2018

OTHER PUBLICATIONS

Chinese Office Action dated Jul. 21, 2023, of the corresponding CN Patent Application No. 202010263662.3.
(Continued)

*Primary Examiner* — Christopher A Johnson
(74) *Attorney, Agent, or Firm* — Muir Patent Law, PLLC

(57) ABSTRACT

An integrated circuit device including a substrate having a cell and interconnection region; and a first stacked structure and a second stacked structure on the first stacked structure, each of the first and second stacked structures including insulating layers and word line structures that are alternately stacked one by one on the substrate in the cell region and the interconnection region, wherein, in the interconnection region the first stacked structure includes a first dummy channel hole penetrating through the first stacked structure, the second stacked structure includes a second dummy channel hole communicatively connected to the first dummy channel hole, the second dummy channel hole penetrating through the second stacked structure, respectively, and a first dummy upper width of an uppermost end of the first dummy channel hole is greater than a second dummy upper width of an uppermost end of the second dummy channel hole.

20 Claims, 27 Drawing Sheets

(51) Int. Cl.
  *H01L 21/768* (2006.01)
  *H01L 23/522* (2006.01)
  *H01L 23/528* (2006.01)
  *H01L 23/535* (2006.01)
  *H10B 41/27* (2023.01)
  *H10B 41/35* (2023.01)
  *H10B 43/35* (2023.01)

(52) U.S. Cl.
  CPC .. *H01L 21/76877* (2013.01); *H01L 21/76895* (2013.01); *H01L 23/5226* (2013.01); *H01L 23/5283* (2013.01); *H01L 23/535* (2013.01); *H01L 29/40114* (2019.08); *H01L 29/40117* (2019.08); *H10B 41/27* (2023.02); *H10B 41/35* (2023.02); *H10B 43/35* (2023.02)

(56) References Cited

U.S. PATENT DOCUMENTS

| | | | |
|---|---|---|---|
| 9,978,766 B1 | 5/2018 | Hosoda et al. | |
| 10,103,169 B1 | 10/2018 | Ge et al. | |
| 10,115,799 B2 | 10/2018 | Park et al. | |
| 10,224,240 B1 | 3/2019 | Funayama et al. | |
| 10,381,369 B2 | 8/2019 | Kim et al. | |
| 10,475,879 B1* | 11/2019 | Pachamuthu | H10B 43/40 |
| 2012/0003800 A1 | 1/2012 | Lee et al. | |
| 2015/0179660 A1 | 6/2015 | Yada et al. | |
| 2015/0194435 A1 | 7/2015 | Lee | |
| 2017/0287926 A1 | 10/2017 | Ariyoshi | |
| 2017/0345843 A1 | 11/2017 | Lee et al. | |
| 2017/0352552 A1 | 12/2017 | Lee | |
| 2017/0352678 A1 | 12/2017 | Lu et al. | |
| 2018/0108671 A1 | 4/2018 | Yu et al. | |
| 2018/0350830 A1* | 12/2018 | Lim | H01L 29/0657 |
| 2019/0006381 A1* | 1/2019 | Nakatsuji | H10B 43/10 |
| 2019/0067321 A1* | 2/2019 | Song | H10B 41/20 |

OTHER PUBLICATIONS

Notice of Allowance dated Aug. 16, 2024 for corresponding KR Patent Application No. 10-2019-0078340.

* cited by examiner

INTEGRATED CIRCUIT DEVICE

CROSS-REFERENCE TO RELATED APPLICATIONS

This is a continuation application based on pending application Ser. No. 16/710,402, filed Dec. 11, 2019, the entire contents of which is hereby incorporated by reference.

Korean Patent Application No. 10-2019-0078340, filed on Jun. 28, 2019, in the Korean Intellectual Property Office, and entitled: "Integrated Circuit Device," is incorporated by reference herein in its entirety.

BACKGROUND

1. Field

Embodiments relate to an integrated circuit device.

2. Description of the Related Art

According to the demand for large capacity and higher integration of an integrated circuit device, vertical memory devices have been considered to increase memory capacity by stacking a plurality of memory cells in a vertical direction on a substrate.

SUMMARY

The embodiments may be realized by providing an integrated circuit device including a substrate having a cell region and an interconnection region; and a first stacked structure and a second stacked structure on the first stacked structure, each of the first stacked structure and second stacked structure including a plurality of insulating layers and a plurality of word line structures that are alternately stacked one by one on the substrate in the cell region and the interconnection region, wherein, in the interconnection region the first stacked structure includes a first dummy channel hole penetrating through the first stacked structure, the second stacked structure includes a second dummy channel hole communicatively connected to the first dummy channel hole, the second dummy channel hole penetrating through the second stacked structure, respectively, and a first dummy upper width of an uppermost end of the first dummy channel hole is greater than a second dummy upper width of an uppermost end of the second dummy channel hole.

The embodiments may be realized by providing an integrated circuit device including a first stacked structure and a second stacked structure on the first stacked structure, each including a plurality of insulating layers and a plurality of word line structures that are alternately stacked one by one on a substrate in a cell region and an interconnection region; and at least two conductive contact plugs electrically connected to any one of the plurality of word line structures in the interconnection region, wherein, in the interconnection region the first stacked structure includes a plurality of first dummy channel holes penetrating through the first stacked structure, the second stacked structure include a plurality of second dummy channel holes that are communicatively connected to the corresponding plurality of first dummy channel holes, the plurality of second dummy channel holes penetrating through the second stacked structure, and a distance between uppermost ends of a pair of first dummy channel holes among the plurality of first dummy channel holes adjacent to each other with one conductive contact plug therebetween that are proximate to the cell region among the at least two conductive contact plugs is less than a distance between uppermost ends of another pair of first dummy channel holes among the plurality of first dummy channel holes adjacent to each other with another conductive contact plug therebetween that are distal to the cell region.

The embodiments may be realized by providing an integrated circuit device including a first stacked structure having edge portions thereof arranged in a stepwise structure in a cell region and a second stacked structure on the first stacked structure, each of the first stacked structure and the second stacked structure including a plurality of insulating layers and a plurality of word line structures that are alternately stacked one by one on a substrate; a plurality of cell channel structures filling a plurality of first cell channel holes penetrating through the first stacked structure in the cell region and a plurality of second cell channel holes that are communicatively connected to the corresponding plurality of first cell channel holes, the plurality of second cell channel holes penetrating through the second stacked structure; a plurality of dummy channel structures filling a plurality of first dummy channel holes penetrating through the first stacked structure in the cell region and a plurality of second dummy channel holes that are communicatively connected to the corresponding plurality of first dummy channel holes, the plurality of second dummy channel holes penetrating through the second stacked structure; and a conductive contact plug electrically connected to any one of the plurality of word line structures in the cell region, the conductive contact plug extending in a vertical direction, wherein a first dummy upper width of an uppermost end of the first dummy channel hole is greater than a second dummy upper width of an uppermost end of the second dummy channel hole, and a first cell upper width of an uppermost end of the first cell channel hole is substantially identical to a second cell upper width of an uppermost s end of the second cell channel hole.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
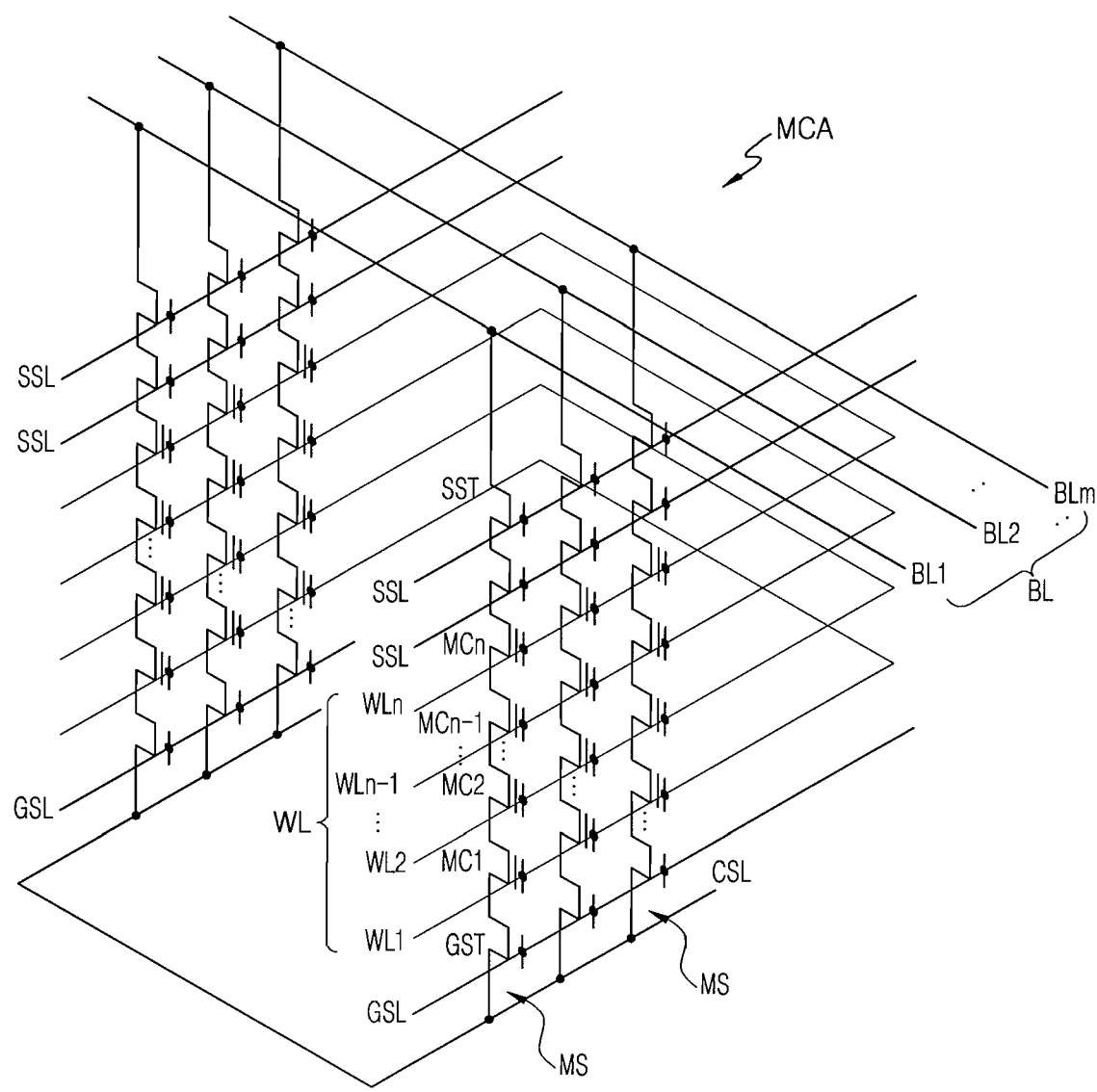
FIG. 1 illustrates an equivalent circuit diagram of a memory cell array of an integrated circuit device, according to example embodiments.

FIG. 1 illustrates an equivalent circuit diagram of a memory cell array of an integrated circuit device, according to example embodiments. FIG. 1 illustrates an equivalent circuit diagram of a vertical NAND flash memory device having a vertical channel structure.

Referring to FIG. 1, a memory cell array MCA may include a plurality of memory cell strings MS. The memory cell array MCA may include first through $m^{th}$ bit lines BL1 through BLm, first through $n^{th}$ word lines WL1 through WLn, at least one string selection line SSL, at least one ground selection line GSL, and a common source line CSL. The plurality of memory cell strings MS may be formed between the first through $m^{th}$ bit lines BL1 through BLm and the common source line CSL.

Each of the plurality of memory cell strings MS may include a string selection transistor SST, a ground selection transistor GST, and first through $n^{th}$ memory cell transistors MC1 through MCn. A conductive plug of the string selection transistor SST may be connected to the first through $m^{th}$ bit lines BL1 through BLm, and a source region of the ground selection transistor GST may be connected to the common source line CSL. The common source line CSL may be a region where the source regions of the plurality of ground selection transistors GST are connected to each other in common.

The string selection transistor SST may be connected to the string selection line SSL, and the ground selection transistor GST may be connected to the ground selection line GSL. The first through $n^{th}$ memory cell transistors MC1 through MCn may be connected to the first through $n^{th}$ word lines WL1 through WLn, respectively.

Figure 7:
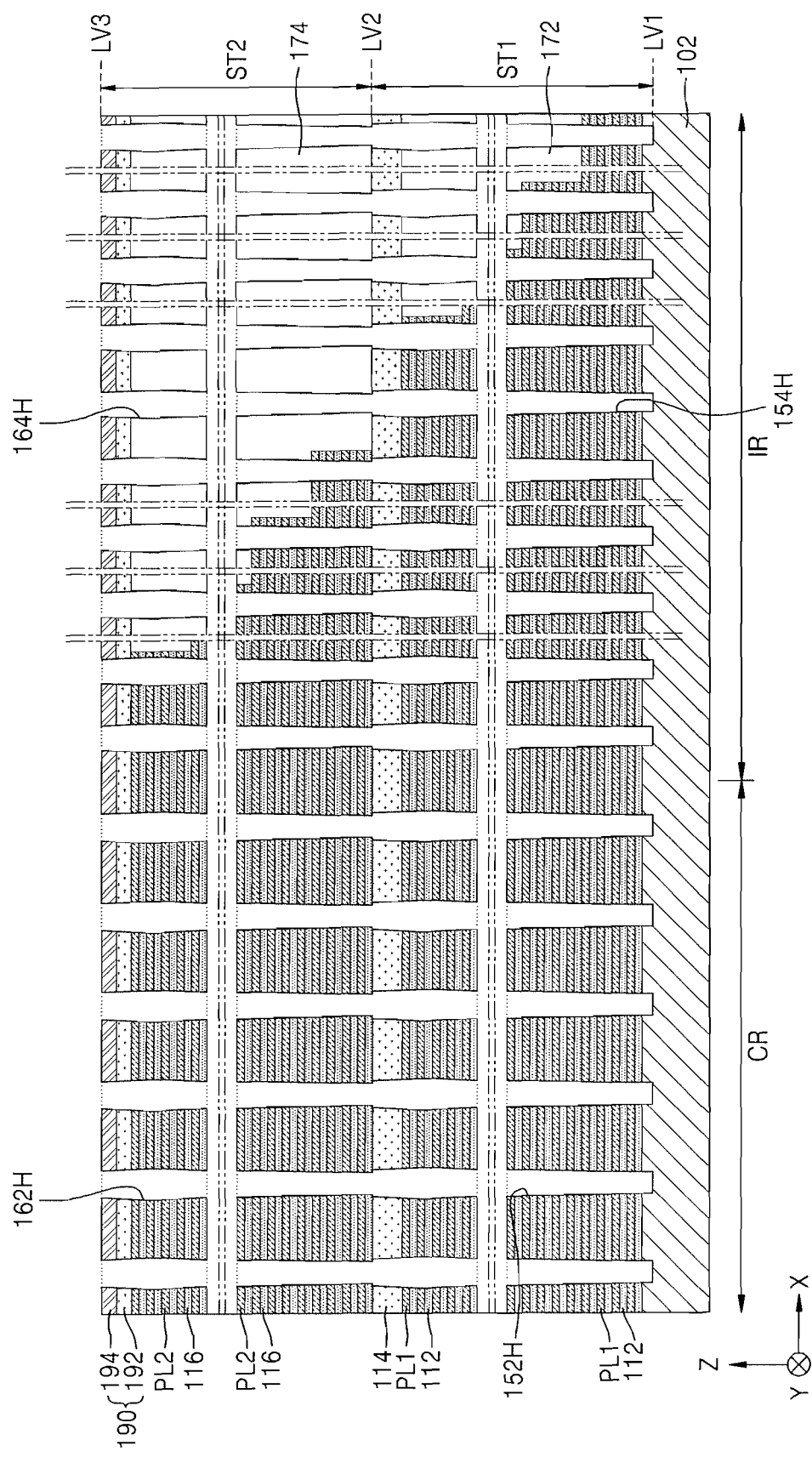
Figure 8:
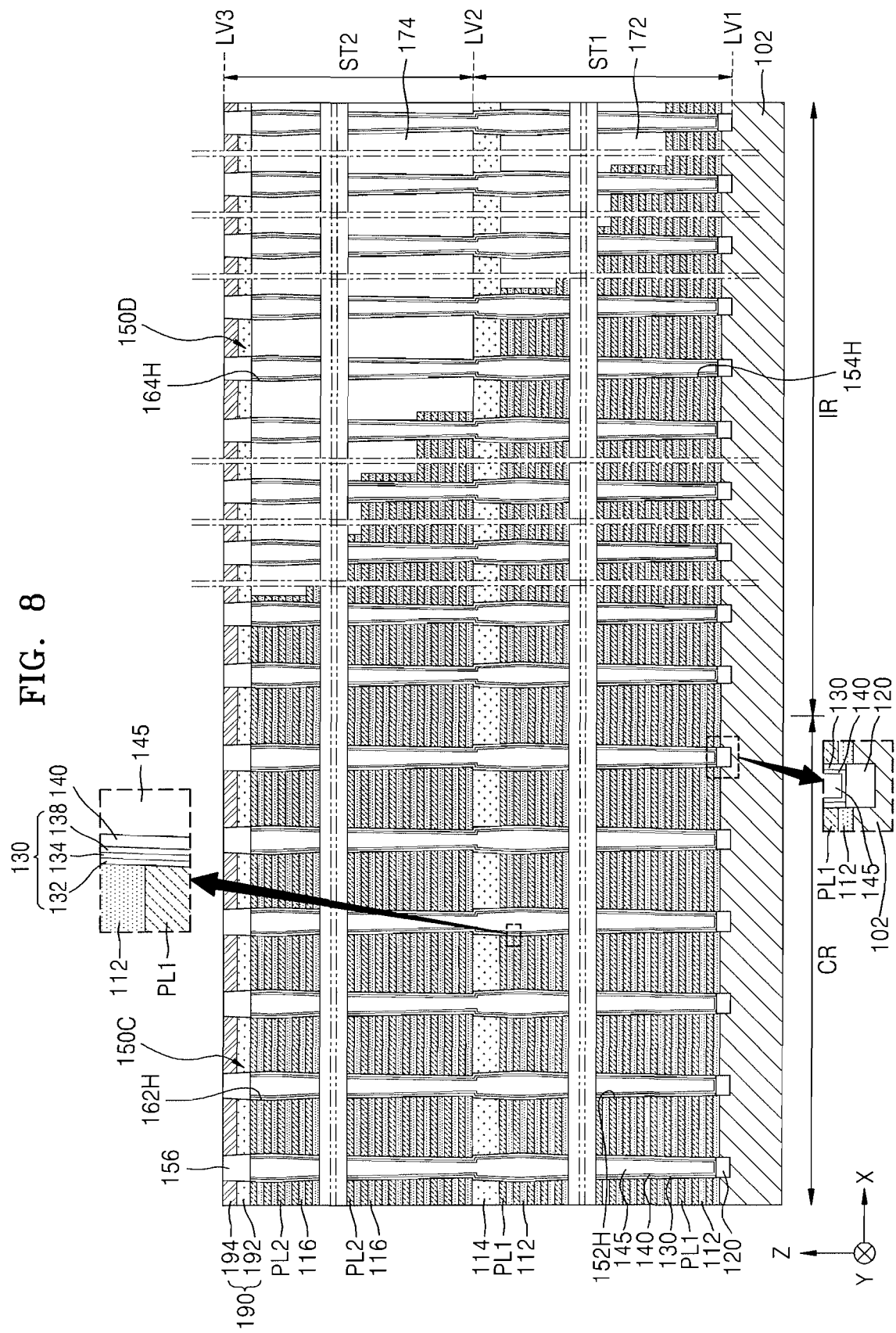
Figure 9:
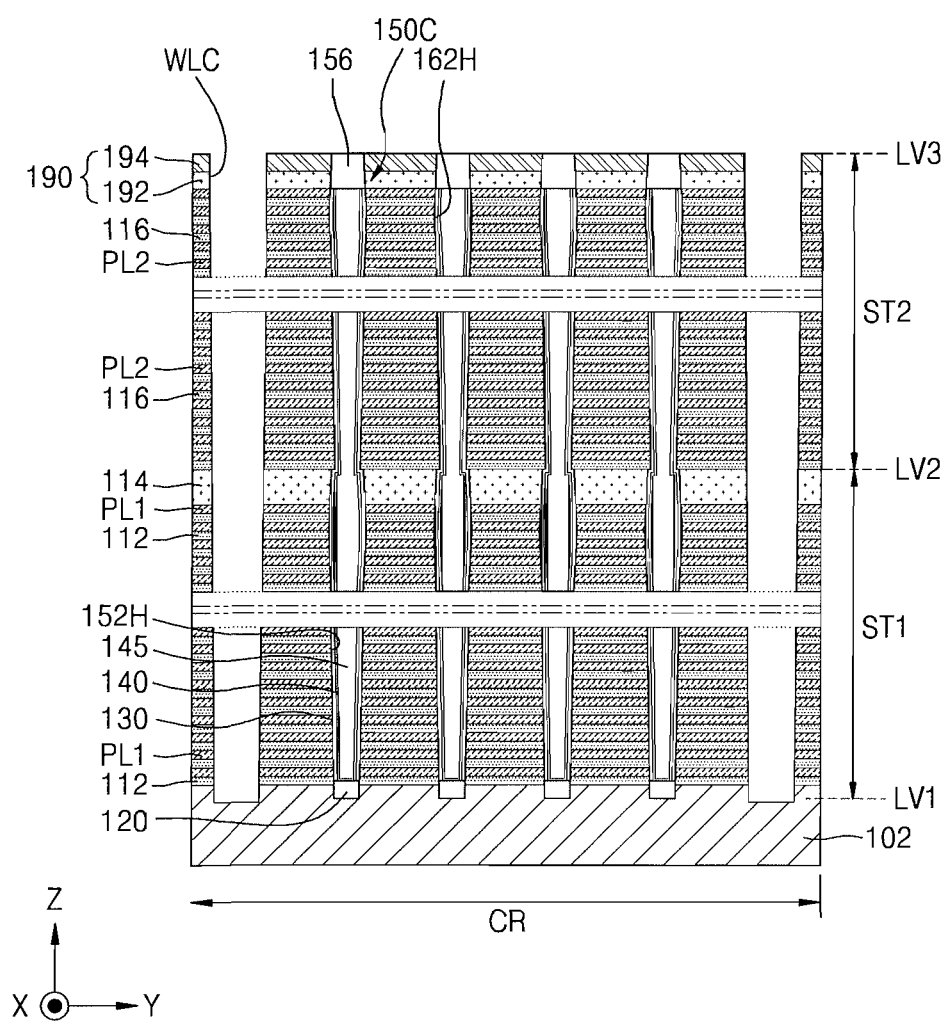
Figure 10A:
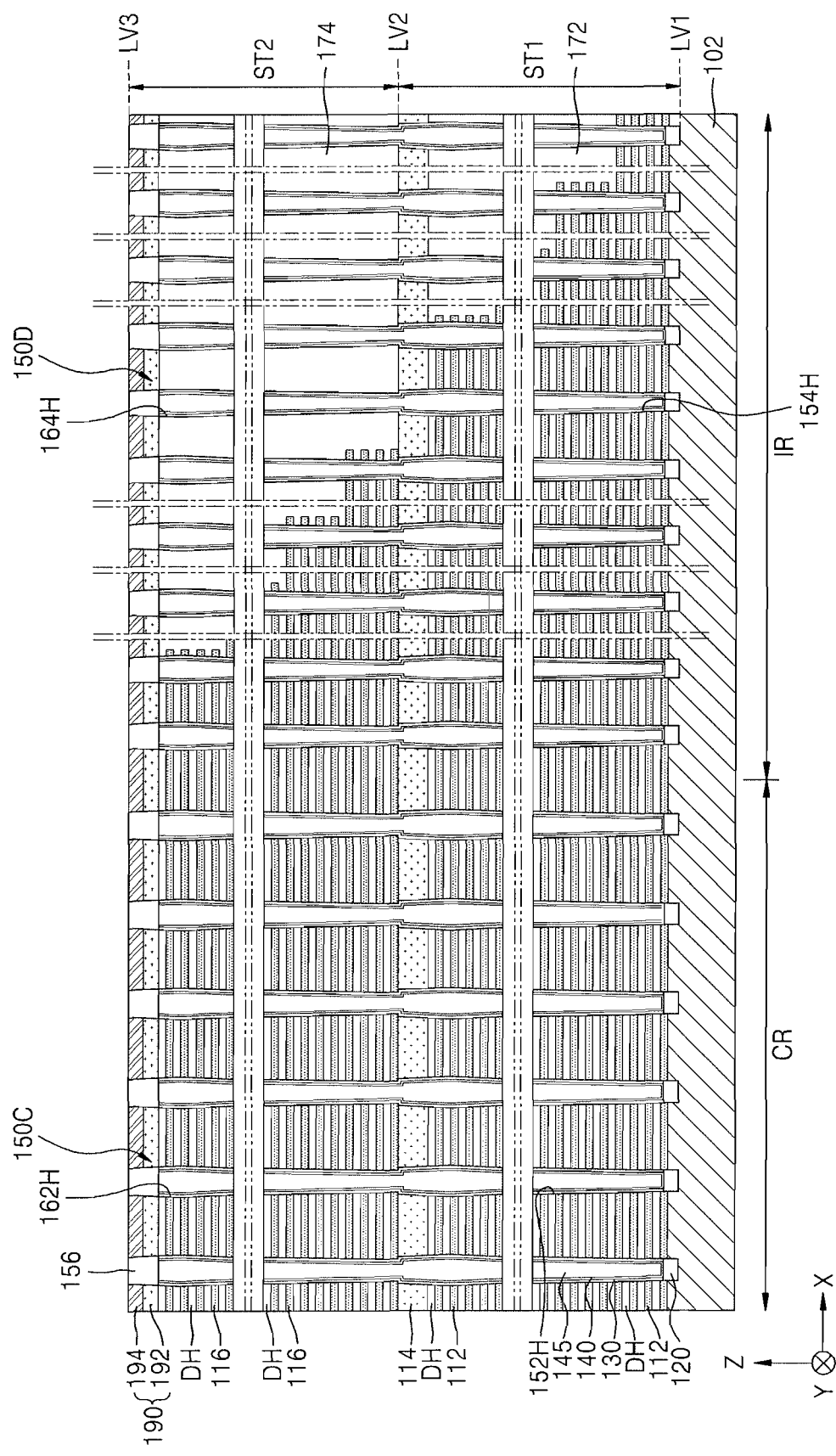
Figure 10B:
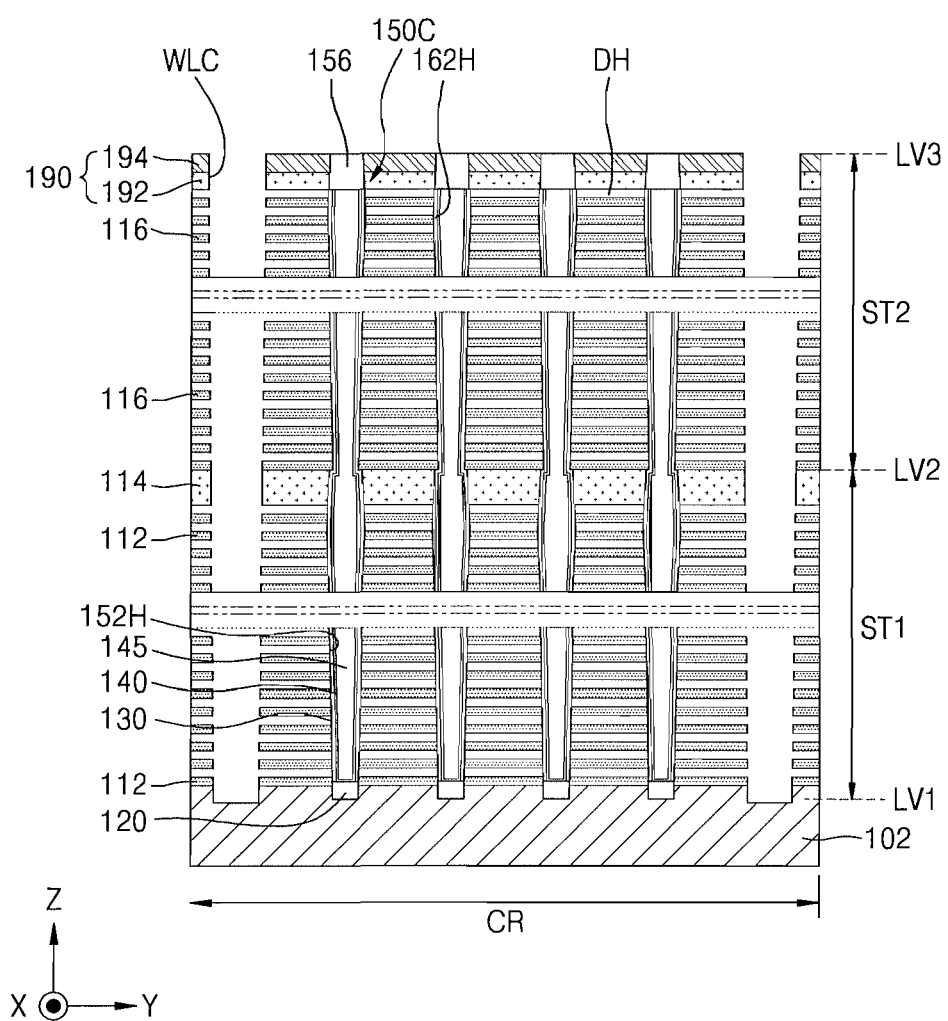
Figure 11A:
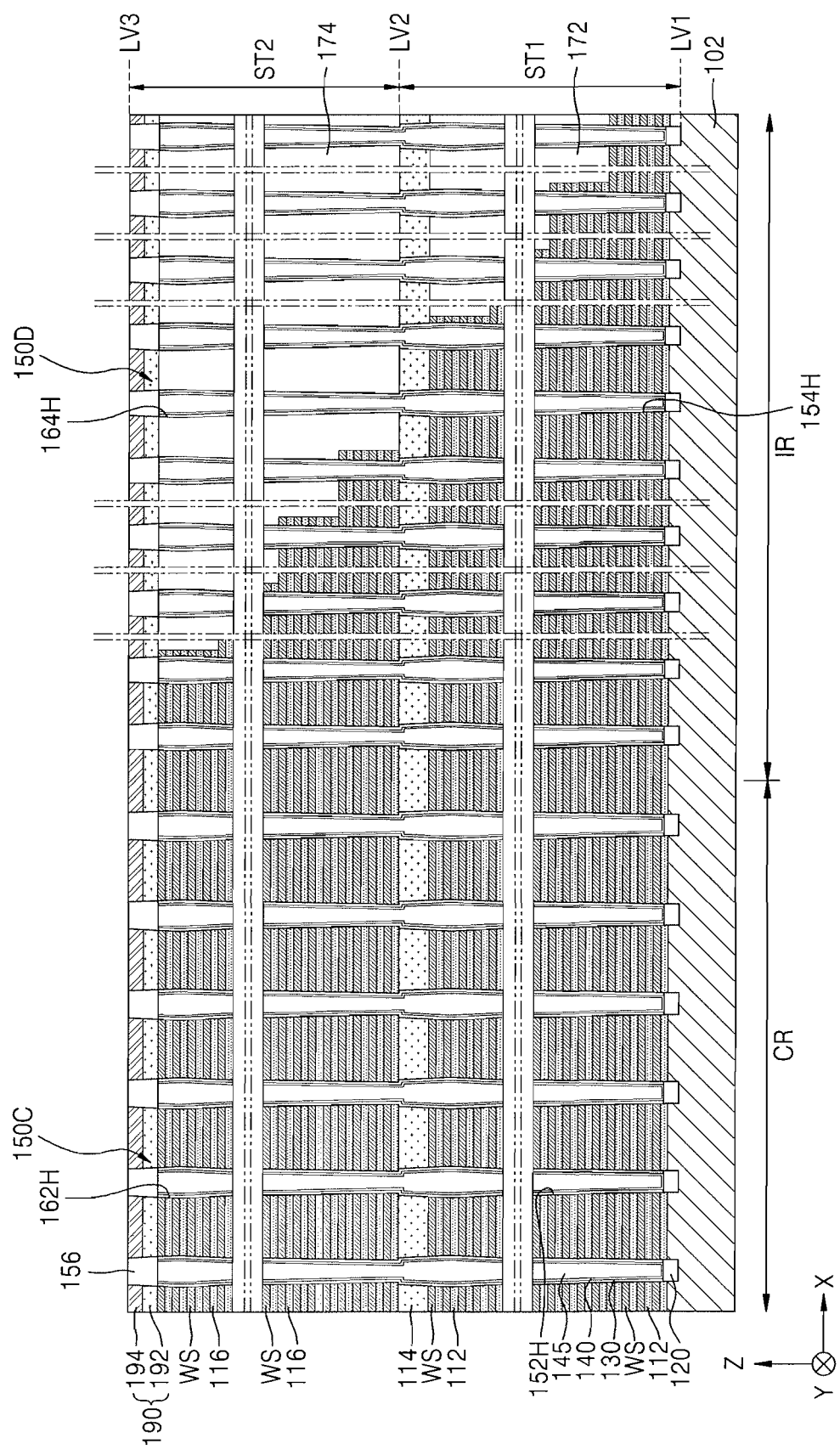
Figure 11B:
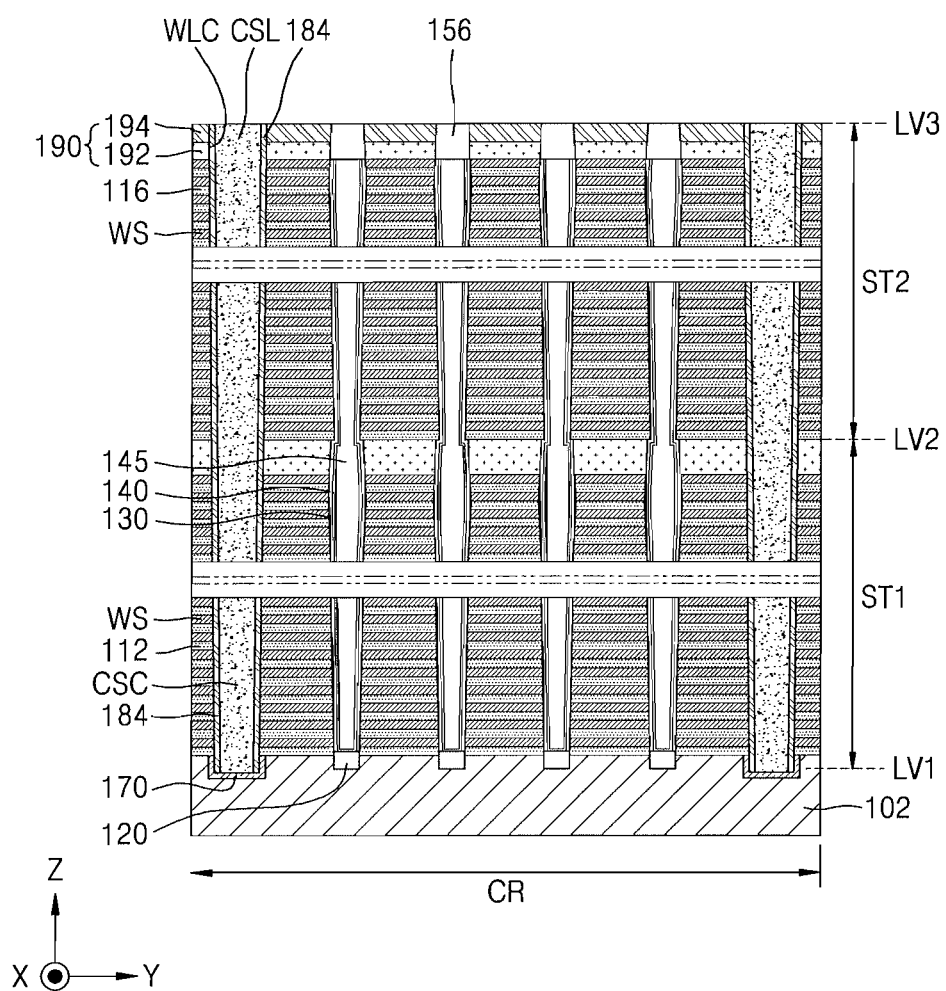

FIGS. 2 through 11B illustrate cross-sectional views of stages in a fabrication method of an integrated circuit device according to example embodiments. FIGS. 2 through 8, 10A, and 11A illustrate cross-sectional views taken along an X-Z plane in a cell region CR and an interconnection region IR, and FIGS. 9, 10B, and 11B illustrate cross-sectional views taken along a Y-Z plane in the cell region CR.

Figure 2:
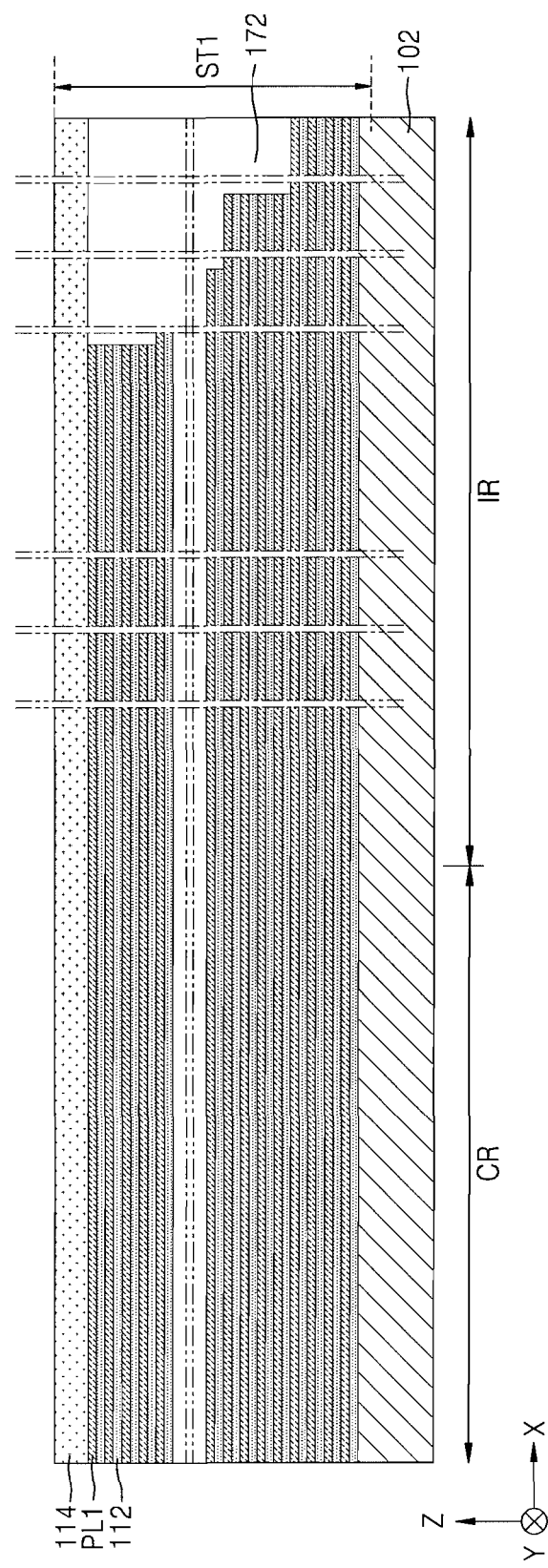
FIGS. 2 through 11B illustrate cross-sectional views of stages in a fabrication method of an integrated circuit device according to example embodiments.

Referring to FIG. 2, a structure may be formed in which a plurality of first insulating layers 112 and a plurality of first sacrificial layers PL1 are alternately stacked one by one on a substrate 102 that has the cell region CR and the interconnection region TR. In an implementation, the substrate 102 may include, e.g., Si, Ge, or SiGe. In an implementation, the substrate 110 may include a silicon-on-insulator (SOI) substrate or a germanium-on-insulator (GeOI) substrate. In an implementation, the plurality of first sacrificial layers PL1 may include a silicon nitride layer, and the plurality of first insulating layers 112 may include a silicon oxide layer.

Next, by removing a portion of the structure in which the plurality of first insulating layers 112 and the plurality of first sacrificial layers PL1 are alternately stacked one by one in the interconnection region IR, edge portions of the structure in which the plurality of first insulating layers 112 and the plurality of first sacrificial layers PL1 are alternately stacked one by one may be formed to have a stepwise structure in the interconnection region IR. For example, the structure in which the plurality of first insulating layers 112 and the plurality of first sacrificial layers PL1 are alternately stacked one by one may have a roughly sloped profile in the interconnection region IR.

A first filling insulating layer 172 may be formed in a portion where the portion of the structure in which the plurality of first insulating layers 112 and the plurality of first sacrificial layers PL1 are alternately stacked one by one has been removed, and a first protective insulating layer 114, which covers the structure in which the plurality of first insulating layers 112 and the plurality of first sacrificial layers PL1 are alternately stacked one by one in the cell region CR and the interconnection region IR, may be formed. In an implementation, the first protective insulating layer 114 may be omitted.

The first protective insulating layer 114 may include, e.g., silicon oxide. The first filling insulating layer 172 may include, e.g., silicon oxide, silicon nitride, silicon oxynitride, or a combination thereof.

A first stack ST1 may include a portion in which the plurality of first insulating layers 112 and the plurality of first sacrificial layers PL1 are arranged. The first stack ST1 may be referred to as a portion in which a plurality of first cell channel holes (152H in FIG. 3) and a plurality of first dummy channel holes (154H in FIG. 3) are formed in a vertical direction (Z direction).

Figure 3:
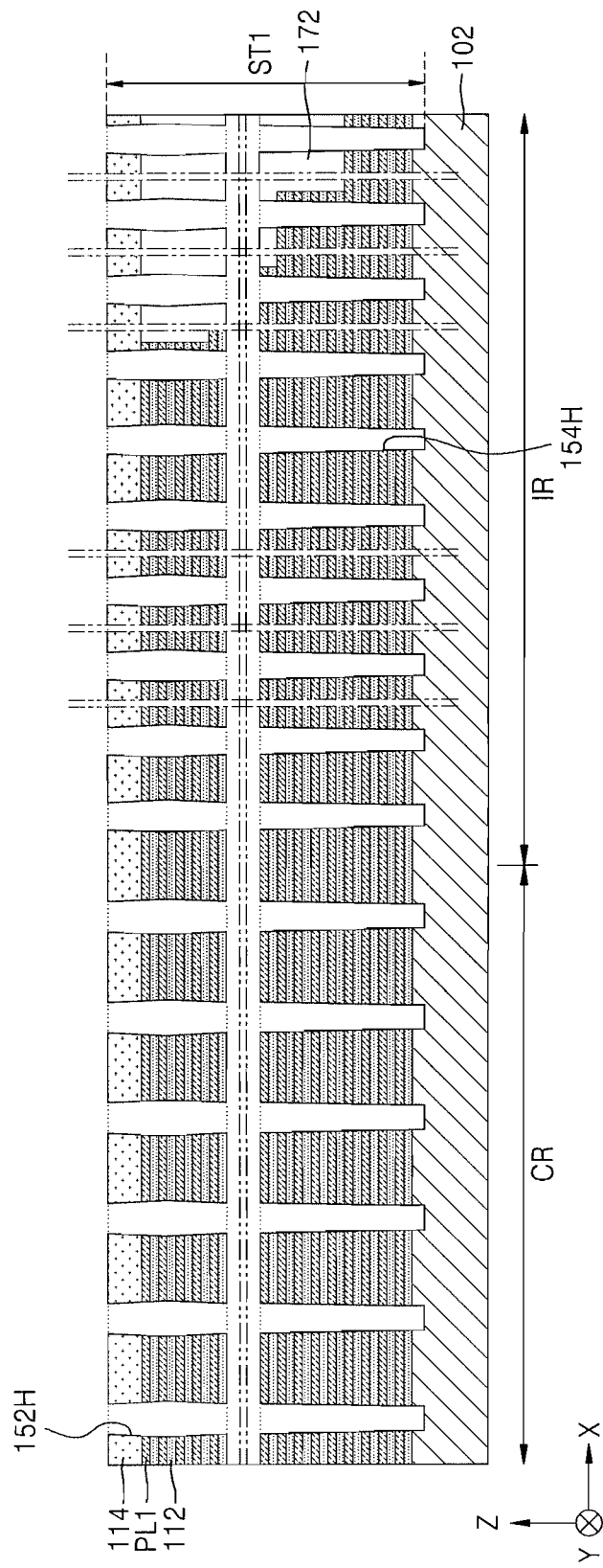

Referring to FIG. 3, a plurality of first cell channel holes 152H penetrating through the plurality of first insulating layers 112 and the plurality of first sacrificial layers PL1 may be formed in the cell region CR, and a plurality of first dummy channel holes 154H penetrating through the first filling insulating layer 172, the plurality of first insulating layers 112, and the plurality of first sacrificial layers PL1 may be formed in the interconnection region IR. When the first protective insulating layer 114 is formed on the plurality of first insulating layers 112 and the plurality of first sacrificial layers PL1, the plurality of first cell channel holes 152H and the plurality of first dummy channel holes 154H may also penetrate through the first protective insulating layer 114.

The plurality of first cell channel holes 152H and the plurality of first dummy channel holes 154H may be formed by anisotropic etching of the first protective insulating layer 114, the first filling insulating layer 172, the plurality of first insulating layers 112, and the plurality of first sacrificial layers PL1. The substrate 102 may be exposed at bottoms of the plurality of first cell channel holes 152H and the plurality of first dummy channel holes 154H.

The first stack ST1 may indicate a portion from top ends to bottom ends of the plurality of first cell channel holes 152H and the plurality of first dummy channel holes 154H in the vertical direction (Z direction). The first stack ST1 may include the first protective insulating layer 114, the first filling insulating layer 172, the plurality of first insulating layers 112, and the plurality of first sacrificial layers PL1. When the plurality of first cell channel holes 152H and the plurality of first dummy channel holes 154H extend inwardly from a top surface of the substrate 102, the first stack ST1 may further include an upper portion of the substrate 102.

In an implementation, the plurality of first cell channel holes 152H and the plurality of first dummy channel holes 154H may have a tapered shape such that widths thereof in a horizontal direction (X direction or Y direction) decrease toward (e.g., proximate or closer to) the substrate 102. In an implementation, widths in the horizontal direction (the X direction or the Y direction) of the first cell channel hole 152H and the first dummy channel hole 154H may have maximum values below the uppermost end (e.g., mouths or openings) of each of the first cell channel hole 152H and the first dummy channel hole 154H, respectively, and may have decreasing values toward the substrate 102 from the portions having the maximum widths, respectively, due to a bowing phenomenon that could occur in the process of anisotropic etching of the first protective insulating layer 114, the first filling insulating layer 172, the plurality of first insulating layers 112, and the plurality of first sacrificial layers PL1.

The width in the horizontal direction (X direction or Y direction) at the uppermost end of each of the plurality of first dummy channel holes 154H may be less than the width in the horizontal direction (X direction or Y direction) at the uppermost end of each of the plurality of first cell channel holes 152H. In an implementation, the width in the horizontal direction (X direction or Y direction) at the lowermost end (e.g., bottom) of each of the plurality of first dummy channel holes 154H may be less than the width in the horizontal direction (X direction or Y direction) at the lowermost end of each of the plurality of first cell channel holes 152H.

Figure 4:
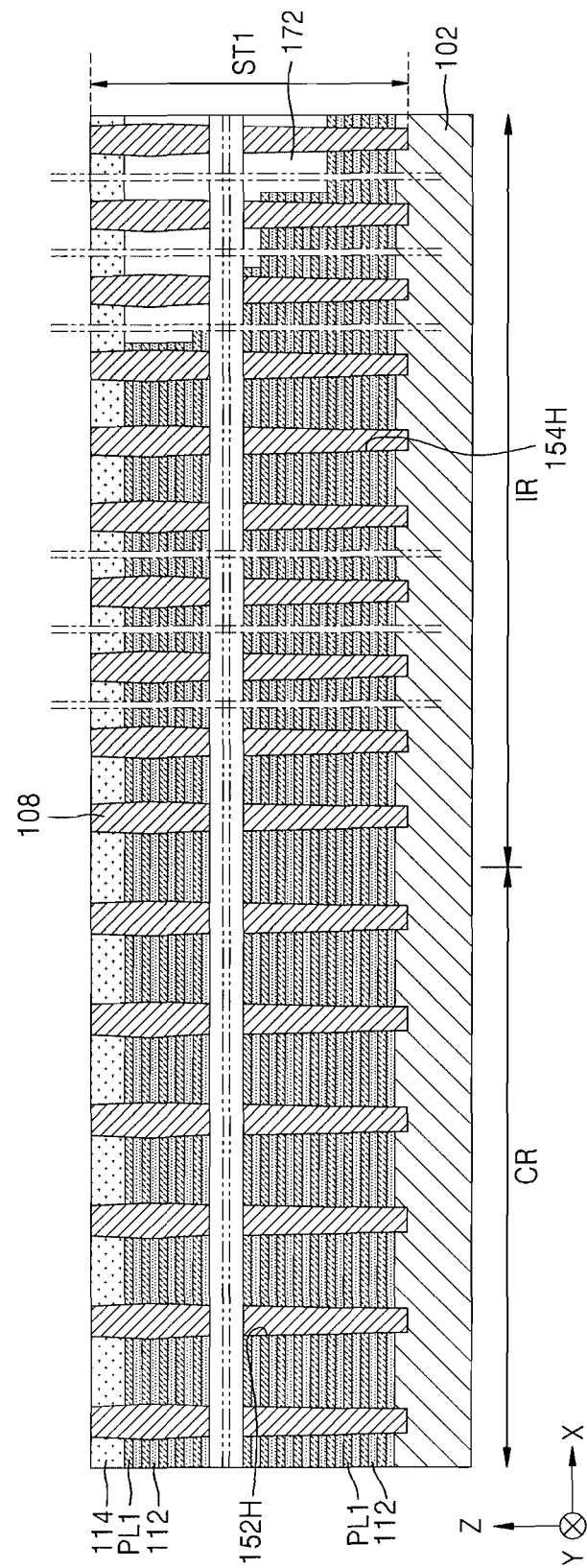

Referring to FIG. 4, a mold layer 108 filling each of the plurality of first cell channel holes 152H and the plurality of first dummy channel holes 154H may be formed. The mold layer 108 may include a material having different characteristics from the first protective insulating layer 114, the first filling insulating layer 172, the plurality of first insulating layers 112, the plurality of first sacrificial layers PL1, and the substrate 102, and a plurality of second insulating layers 116, a plurality of second sacrificial layers PL2, a second filling insulating layer 174, and a second protective insulating layer 190, which are to be formed in FIG. 5. In an implementation, the mold layer 108 may include, e.g., a material containing carbon (C).

Figure 5:
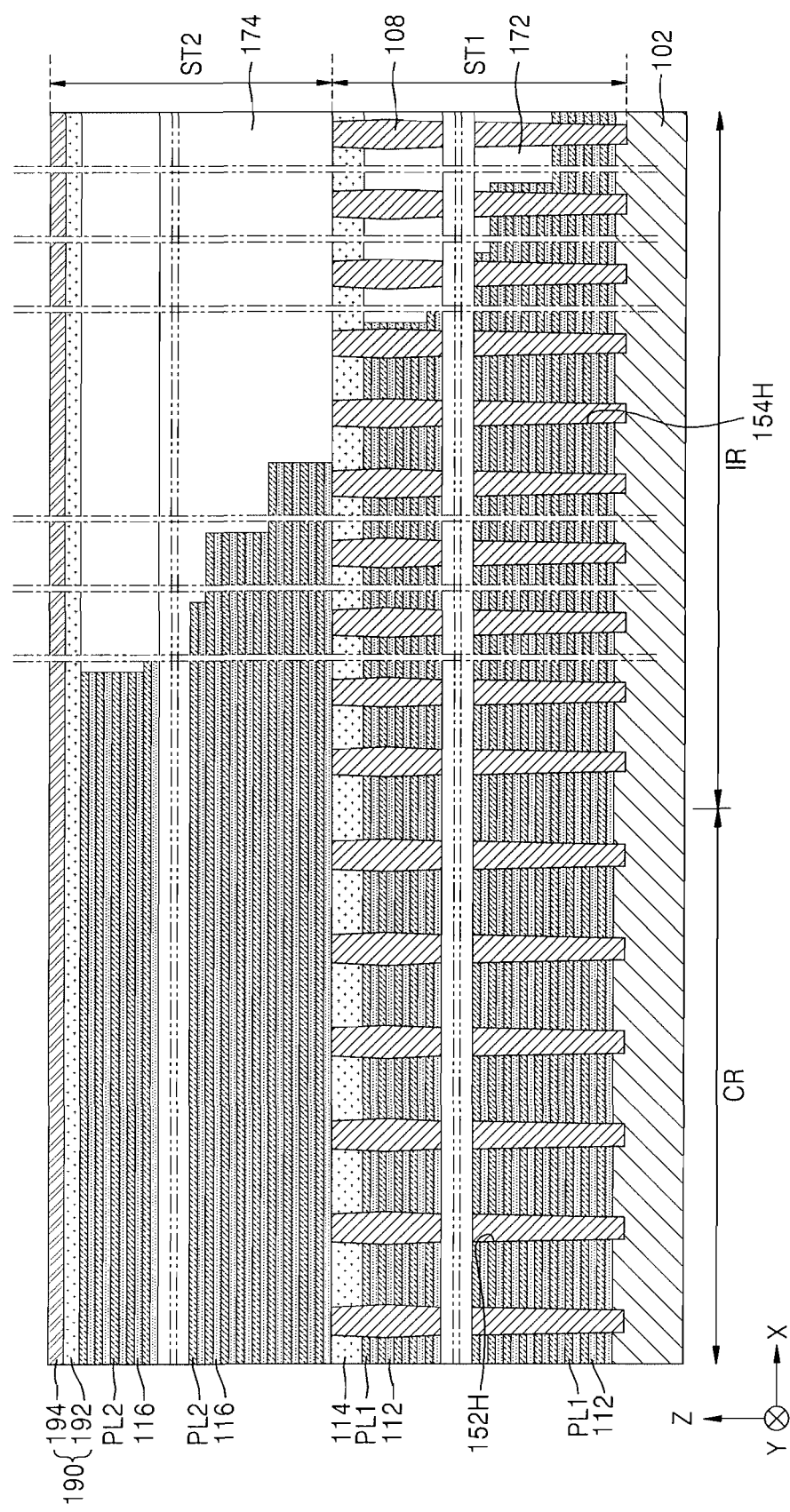

Referring to FIG. 5, in the cell region CR and the interconnection region IR, a structure in which the plurality of second insulating layers 116 and the plurality of second sacrificial layers PL2 are alternately stacked one by one may be formed. In the present specification, the structure in which the plurality of first insulating layers 112 and the plurality of first sacrificial layers PL1 are alternately stacked one by one may be referred to as a first preliminary stacked structure, and the structure in which the plurality of second insulating layers 116 and the plurality of second sacrificial layers PL2 are alternately stacked one by one may be referred to as a second preliminary stacked structure. In an implementation, the plurality of second sacrificial layers PL2 may include a silicon nitride layer, and the plurality of second insulating layers 116 may include a silicon oxide layer. In an implementation, the plurality of first sacrificial layers PL1 and the plurality of second sacrificial layers PL2 may include the same material, and the plurality of first insulating layers 112 and the plurality of second insulating layers 116 may include the same material. For example, the plurality of first sacrificial layers PL1 and the plurality of second sacrificial layers PL2 may include different materials having similar etching characteristics, and the plurality of first insulating layers 112 and the plurality of second insulating layers 116 may include different materials having similar etching characteristics.

Next, by removing a portion of the structure in which the plurality of second insulating layers 116 and the plurality of second sacrificial layers PL2 are alternately stacked one by one in the interconnection region IR, e.g., by removing a portion of the second preliminary stacked structure, an edge portion of the second preliminary stacked structure may be formed to have a stepwise structure in the interconnection region TR. For example, the second preliminary stacked structure may have a roughly sloped profile in the interconnection region TR. In addition, the first preliminary stacked structure and the second preliminary stacked structure may have a sloped profile in the interconnection region R.

The second filling insulating layer 174 may be formed in a portion where a portion of the second preliminary stacked structure has been removed, and the second protective insulating layer 190 covering the second preliminary stacked structure and the second filling insulating layer 174 may be formed in the cell region CR and the interconnection region IR. The second protective insulating layer 190 may include an oxide layer, a nitride layer, or a combination thereof. The second filling insulating layer 174 may include silicon oxide, silicon nitride, silicon oxynitride, or a combination thereof.

The second protective insulating layer 190 may include a first layer 192 and a second layer 194. In an implementation, the first layer 192 may include the same material as the first protective insulating layer 114. In an implementation, the second protective insulating layer 190 may be omitted. In an implementation, the second protective insulating layer 190 may include only the first layer 192, and the second layer 194 may be omitted.

A second stack ST2 may include a portion in which the plurality of second insulating layers 116 and the plurality of second sacrificial layers PL2 are arranged. The second stack ST2 may be referred to as a portion in which a plurality of second cell channel holes (162H in FIG. 6) and a plurality of second dummy channel holes (164H in FIG. 6) are formed in the vertical direction (Z direction).

Figure 6:
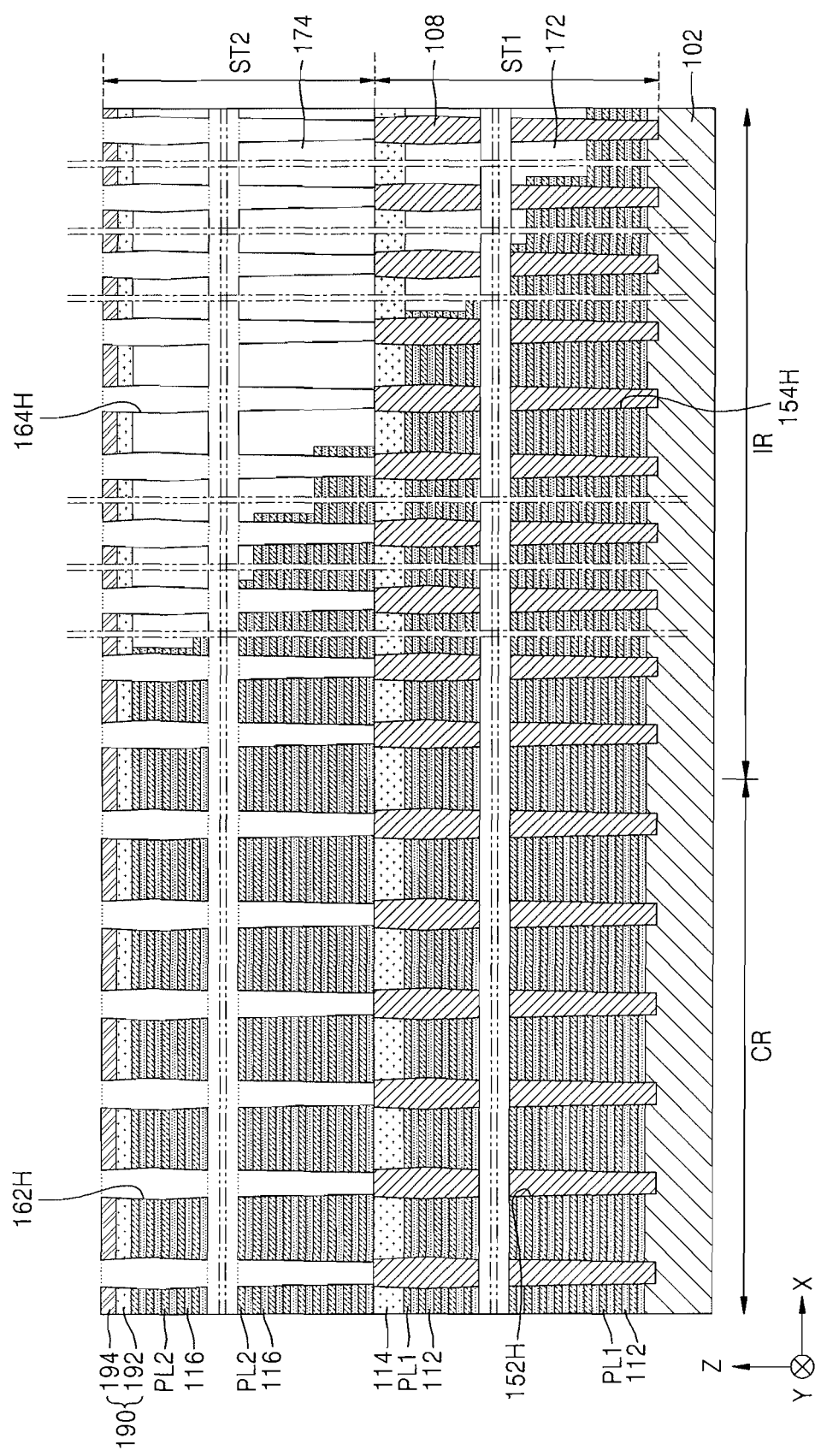

Referring to FIG. 6, in the cell region CR, a plurality of second cell channel holes 162H penetrating through the plurality of second insulating layers 116 and the plurality of second sacrificial layers PL2 may be formed. In the interconnection region IR, a plurality of second dummy channel holes 164H penetrating through the second filling insulating layer 177, the plurality of second insulating layers 116, and the plurality of second sacrificial layers PL2 may be formed. When the second protective insulating layer 190 is formed on the plurality of first insulating layers 112 and the plurality of second sacrificial layers PL2, the plurality of second cell channel holes 162H and the plurality of second dummy channel holes 164H may also penetrate through the second protective insulating layer 190.

The plurality of second cell channel holes 162H and the plurality of second dummy channel holes 164H may be formed by anisotropic etching of the second protective insulating layer 190, the second filling insulating layer 174, the plurality of second insulating layers 116, and the plurality of second sacrificial layers PL2. The mold layer 108 filling the plurality of first cell channel holes 152H and the plurality of first dummy channel holes 154H may be exposed at bottoms of the plurality of second cell channel holes 162H and the plurality of second dummy channel holes 164H.

The second stack ST2 may indicate a portion from uppermost ends (e.g., mouths or openings) to lowermost ends (e.g., bottoms) of the plurality of second cell channel holes 162H and the plurality of second dummy channel holes 164H in the vertical direction (Z direction). The second stack ST2 may include the second protective insulating layer 190, the second filling insulating layer 174, the plurality of second insulating layers 116, and the plurality of second sacrificial layers PL2.

In an implementation, the plurality of second cell channel holes 162H and the plurality of second dummy channel holes 164H may have a tapered shape such that a width thereof in the horizontal direction (X direction or Y direction) decreases toward or closer to the substrate 102. In an implementation, the widths of the second cell channel hole 162H and the second dummy channel hole 164H in the horizontal direction (the X direction or the Y direction) may have maximum values below the uppermost end of each of the second cell channel hole 162H and the second dummy channel hole 164H, respectively, and may have decreasing values toward the substrate 102 from the portions having the maximum widths, respectively, due to a bowing phenomenon that could occur in the process of anisotropic etching of the second protective insulating layer 190, the second filling insulating layer 174, the plurality of second insulating layers 116, and the plurality of second sacrificial layers PL2.

In an implementation, the width in the horizontal direction (the X direction or the Y direction) at the uppermost end of each of the plurality of second dummy channel holes 164H may be less than the width in the horizontal direction (the X direction or the Y direction) at the uppermost end of each of the plurality of second cell channel holes 162H. In an implementation, the width in the horizontal direction (the X direction or the Y direction) at the lowermost end of each of the plurality of second dummy channel holes 164H may be less than the width in the horizontal direction (the X direction or the Y direction) at the lowermost end of each of the plurality of second cell channel holes 162H.

The width of the uppermost end of each of the plurality of second dummy channel holes 164H in the horizontal direction (X direction or Y direction) may be less than the width of the uppermost end of each of the plurality of first dummy channel holes 154H in the horizontal direction (X direction or Y direction). The width of the lowermost end of each of the plurality of second dummy channel holes 164H in the horizontal direction (X direction or Y direction) may be less than the width of the uppermost end of each of the plurality of first dummy channel holes 154H in the horizontal direction (X direction or Y direction). The width of the lowermost end of each of the plurality of second dummy channel holes 164H in the horizontal direction (X direction or Y direction) may be less than the width of the lowermost end of each of the plurality of first dummy channel holes 154H in the horizontal direction (X direction or Y direction).

The width of the uppermost end of each of the plurality of second cell channel holes 162H in the horizontal direction (X direction or Y direction) may be less than the width of the uppermost end of each of the plurality of first cell channel holes 152H in the horizontal direction (X direction or Y direction). The width of the lowermost end of each of the plurality of second cell channel holes 162H in the horizontal direction (X direction or Y direction) may be less than the width of the uppermost end of each of the plurality of first cell channel holes 152H in the horizontal direction (X direction or Y direction). The width of the lowermost end of each of the plurality of first dummy channel holes 154H in the horizontal direction (X direction or Y direction) may be less than the width of the lowermost end of each of the plurality of first cell channel holes 152H in the horizontal direction (X direction or Y direction).

Referring to FIG. 7, by removing the mold layer (108 in FIG. 6) from the plurality of first cell channel holes 152H and the plurality of first dummy channel holes 154H by using the plurality of second cell channel holes 162H and the plurality of second dummy channel holes 164H, the plurality of second cell channel holes 162H may be communicatively connected to the plurality of first cell channel holes 152H, and the plurality of second dummy channel holes 164H may be communicatively connected to the plurality of first dummy channel holes 154H.

The first cell channel hole 152H and the second cell channel hole 162H that are communicatively connected to each other may be referred to as cell channel holes, and the first dummy channel hole 154H and the second dummy channel hole 164H that are communicatively connected to each other may be referred to as dummy channel holes.

The cell channel hole may include the first cell channel hole 152H extending from a first level LV1 to a second level LV2 in the vertical direction (Z direction), and the second cell channel hole 162H extending from the second level LV2 to a third level LV3 in the vertical direction (Z direction). The dummy channel hole may include the first dummy channel hole 154H extending from the first level LV1 to the second level LV2 in the vertical direction (Z direction), and the second dummy channel hole 164H extending from the second level LV2 to the third level LV3 in the vertical direction (Z direction). The second level LV2 may be farther from the substrate 102 than the first level LV1 in the vertical direction (Z direction), and the third level LV3 may be farther from the substrate 102 than the second level LV2 in the vertical direction (Z direction).

Referring to FIG. 8, a plurality of cell channel structures 150C filling the plurality of second cell channel holes 162H and the plurality of first cell channel holes 152H, and a plurality of dummy channel structures 150D filling the plurality of second dummy channel holes 164H and the plurality of first cell channel holes 152H may be formed.

Each of the plurality of cell channel structures 150C and the plurality of dummy channel structures 150D may include a semiconductor pattern 120, a charge storage structure 130, a channel layer 140, a filling insulating layer 145, and a conductive plug layer 156.

The semiconductor pattern 120 may be in contact with the substrate 102, and may fill a portion of each of the plurality of cell channel holes and the plurality of dummy channel holes, e.g., a lower portion of each of the plurality of first cell channel holes 152H and the plurality of first dummy channel holes 154H. The semiconductor pattern 120 may be formed by performing a selective epitaxial growth (SEG) using the substrate 102 that is exposed at the bottoms of the plurality of first cell channel holes 152H and the plurality of first dummy channel holes 154H as a seed. A top surface of the semiconductor pattern 120 may be at a level that is between a top surface of the first sacrificial layer PL1 closest to the substrate 102 among the plurality of first sacrificial layers PL1, and a bottom surface of the first insulating layer 112 closest to the substrate 102 among the plurality of first insulating layers 112. The semiconductor pattern 120 may function as a channel similarly to the channel layer 140. The semiconductor pattern 120 may include Si or Ge. In an implementation, the semiconductor pattern 120 may include a semiconductor doped with impurities.

The channel layer 140 may contact the semiconductor pattern 120 and may extend in the vertical direction (Z direction) in each of the plurality of cell channel structures 150C and the plurality of dummy channel structures 150D. In an implementation, the channel layer 140 may have a cylindrical shape having an internal space therein (e.g., a hollow cylindrical shape). The channel layer 140 may include polysilicon doped with impurities and polysilicon not doped with impurities.

The filling insulating layer 145 may fill an inner space of each of the plurality of cell channel holes and the plurality of dummy channel holes defined by the channel layer 140. The filling insulating layer 145 may include silicon oxide, silicon nitride, silicon oxynitride, or a combination thereof. In an implementation, the filling insulating layer 115 may be omitted, and in this case, the channel layer 140 may have a pillar structure without an internal space therein.

The conductive plug layer 156 may be in contact with the filling insulating layer 145 and the channel layer 140, and may fill an upper portion of an inlet side (e.g., mouth or opening) of each of the plurality of cell channel holes and the plurality of dummy channel holes. The conductive plug layer 156 may include a polysilicon layer doped with impurities. The plurality of conductive plug layers 156 included in the plurality of cell channel structures 150C and the plurality of dummy channel structures 150D may be insulated from each other by the second protective insulating layer 190.

The charge storage structure 130 may include a tunneling dielectric layer 132, a charge storage layer 134, and a blocking dielectric layer 138. The charge storage structure 130 may be between the plurality of first sacrificial layers PL1 and the plurality of channel layers 140, and between the plurality of second sacrificial layers PL2 and the plurality of channel layers 140. In an implementation, the charge storage structure 130 may have a cylindrical shape extending in the vertical direction (Z direction) along a sidewall of each of the plurality of cell channel holes and the plurality of dummy channel holes. In an implementation, at least one of the tunneling dielectric layer 132, the charge storage layer 134, and the blocking dielectric layer 138, which constitute the charge storage structure 130, may be spaced apart from each other in the vertical direction (Z direction) and have a ring shape.

The tunneling dielectric layer 132 may include a silicon oxide layer. The charge storage layer 134 may include silicon nitride, polysilicon, or polysilicon doped with impurities. In an implementation, the charge storage layer 134 may include a charge trap layer including a silicon nitride layer. In an implementation, the charge storage layer 134 may be a floating gate including polysilicon or polysilicon doped with impurities. The blocking dielectric layer 138 may include a silicon oxide layer or a silicon oxynitride layer.

Referring to FIG. 9, by removing a portion of the second stack ST2 including the plurality of second sacrificial layers PL2 and the plurality of second insulating layers 116, and a portion of the first stack ST1 including the plurality of first sacrificial layers PL1 and the plurality of first insulating layers 112, a word line cut region WLC may be formed. The substrate 102 may be exposed at a bottom of the word line cut region WLC.

Referring to FIGS. 10A and 10B together, by removing the plurality of first sacrificial layers PL1 and the plurality of second sacrificial layers PL2 by using the word line cut region WLC, a plurality of word line spaces DH communicatively connected to the word line cut region WLC may be formed.

Referring to FIGS. 11A and 11B together, a plurality of word line structures WS filling the plurality of word line spaces (DH in FIGS. 10A and 10B) may be formed. After forming a word line material layer filling the plurality of word line spaces DH and the word line cut region WLC, the plurality of word line structures WS may be formed by removing a portion of the word line material layer formed in the word line cut region WLC.

The plurality of word line structures WS may extend in the horizontal direction (X direction or Y direction) on the substrate 102 and overlap each other in the vertical direction (Z direction) perpendicular to the substrate 102. The word line structure WS may include a metal such as tungsten, nickel, cobalt, and tantalum, a metal silicide such as tungsten silicide, nickel silicide, cobalt silicide, and tantalum silicide, polysilicon doped with impurities, or a combination thereof.

In the present specification, a structure in which the plurality of first insulating layers 112 and the plurality of word line structures WS are alternately stacked one by one in the first stack ST1 may be referred to as a first stacked structure, and a structure in which the plurality of second insulating layers 116 and the plurality of word line structures WS are alternately stacked one by one in the second stack ST2 may be referred to as a second stacked structure. In addition, the first insulating layer 112 may be referred to as an insulating layer of the first stack ST1, and the second insulating layer 116 may be referred to as an insulating layer of the second stack ST2. Edge portions of the first stacked structure and the second stacked structure may have a stepwise structure.

Next, a common source line CSL filling the word line cut region WLC may be formed. The common source line CSL may extend in a first horizontal direction (X direction). An insulating spacer 184 covering a sidewall of the common source line CSL may be formed in the word line cut region WLC. The insulating spacer 184 may electrically insulate spaces between the common source line CSL and the plurality of word line structures WS. The common source line CSL may include a metal, e.g., tungsten, copper, and aluminum, a conductive metal nitride such as titanium nitride and tantalum nitride, a transition metal such as titanium and tantalum, or a combination thereof. The insulating spacer 184 may include, e.g., a silicon oxide layer, a silicon nitride layer, a silicon oxynitride layer, or a combination thereof. A common source region may be formed in a portion of the substrate 102 in contact with the common source line CSL. The common source region may be an impurity region including n-type impurities heavily doped thereon.

In an implementation, a metal silicide layer 170 (for reducing contact resistance) may be between the common source region and the common source line CSL. For example, the metal silicide layer 170 may include cobalt silicide, tungsten silicide, nickel silicide, or the like.

In an implementation, a capping insulating layer covering a top surface of the common source line CSL may be formed on an upper portion of the word line cut region WLC. The capping insulating layer may include a silicon oxide layer, a silicon nitride layer, a silicon oxynitride layer, or a combination thereof.

Figure 12A:
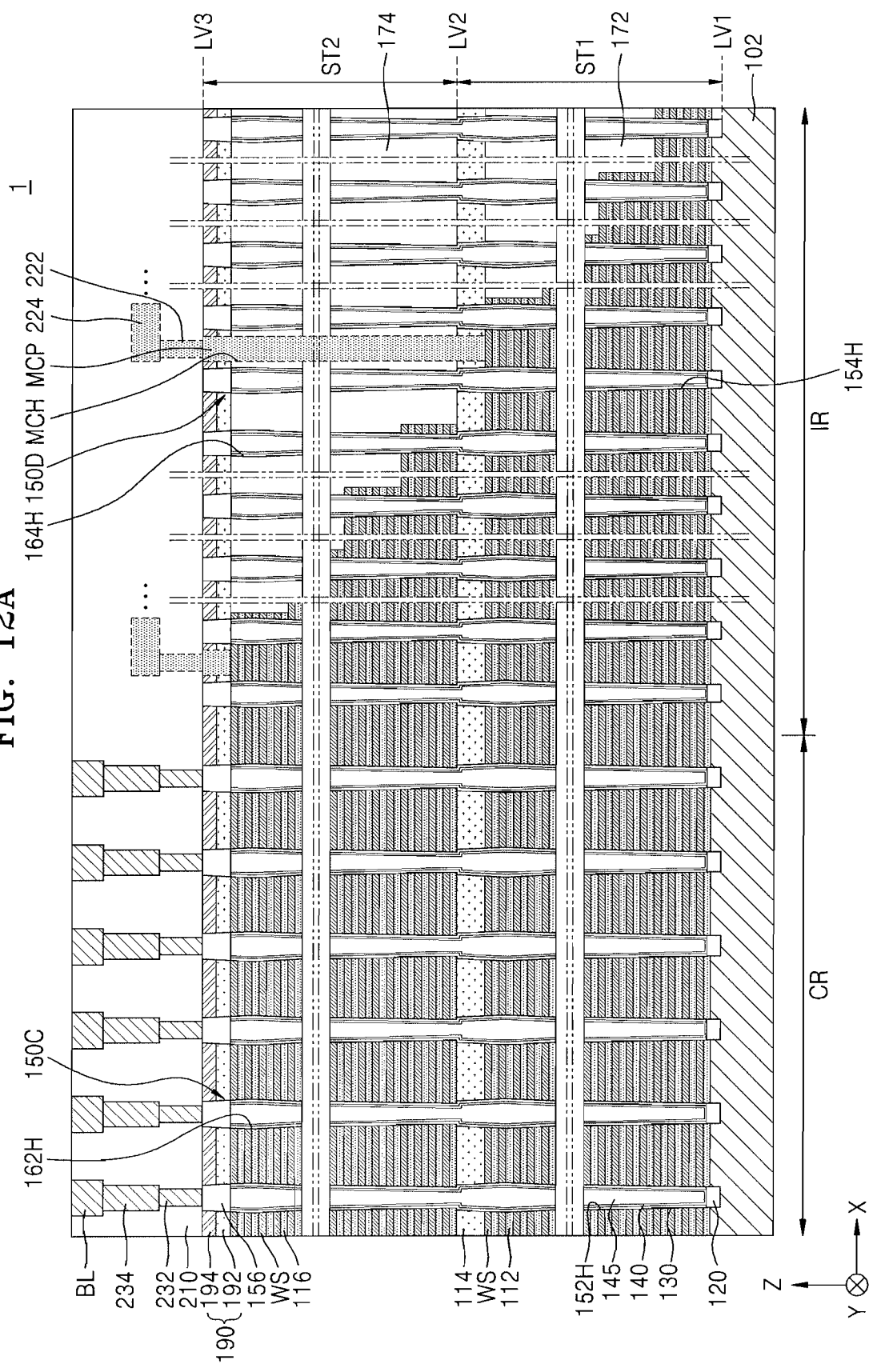
FIGS. 12A and 12B illustrate cross-sectional views of an integrated circuit device according to example embodiments.
Figure 12B:
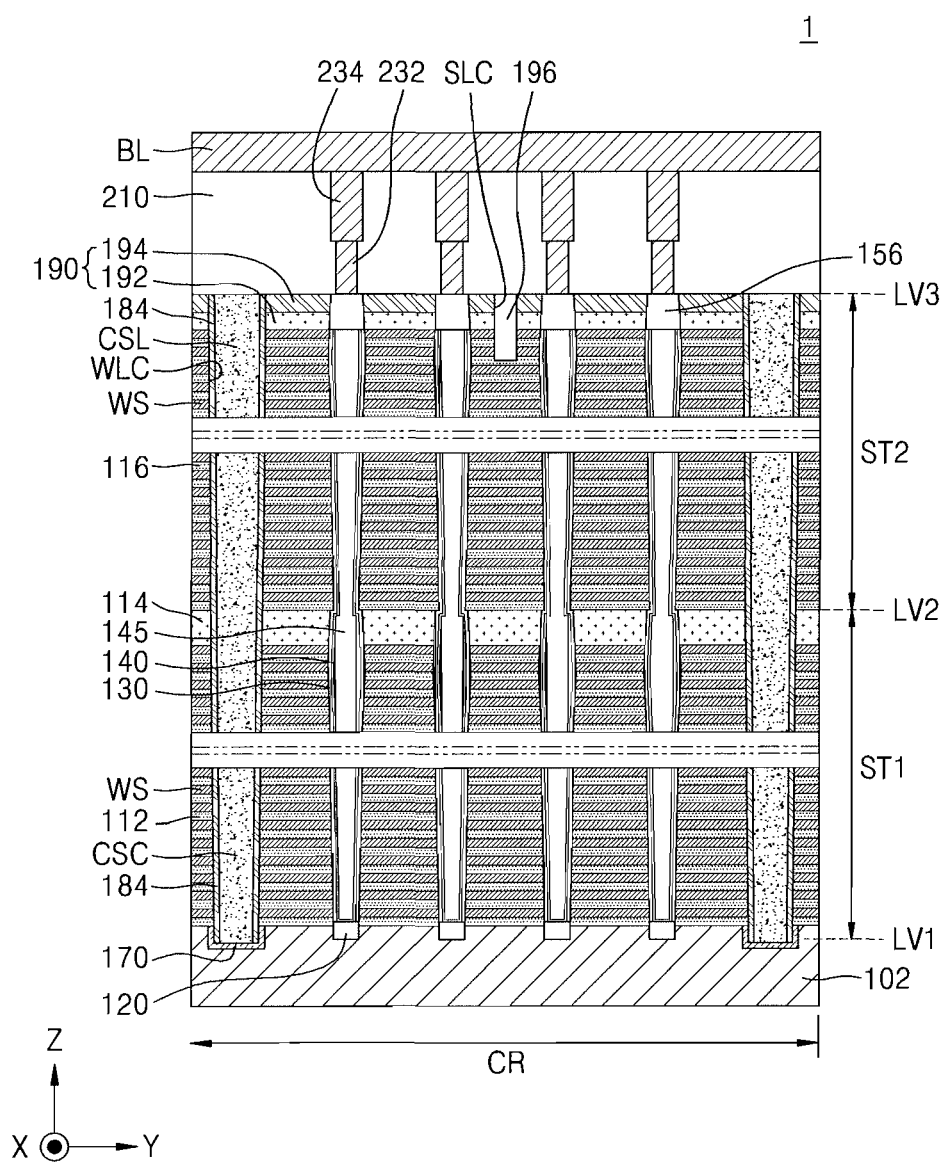
Figure 12C:
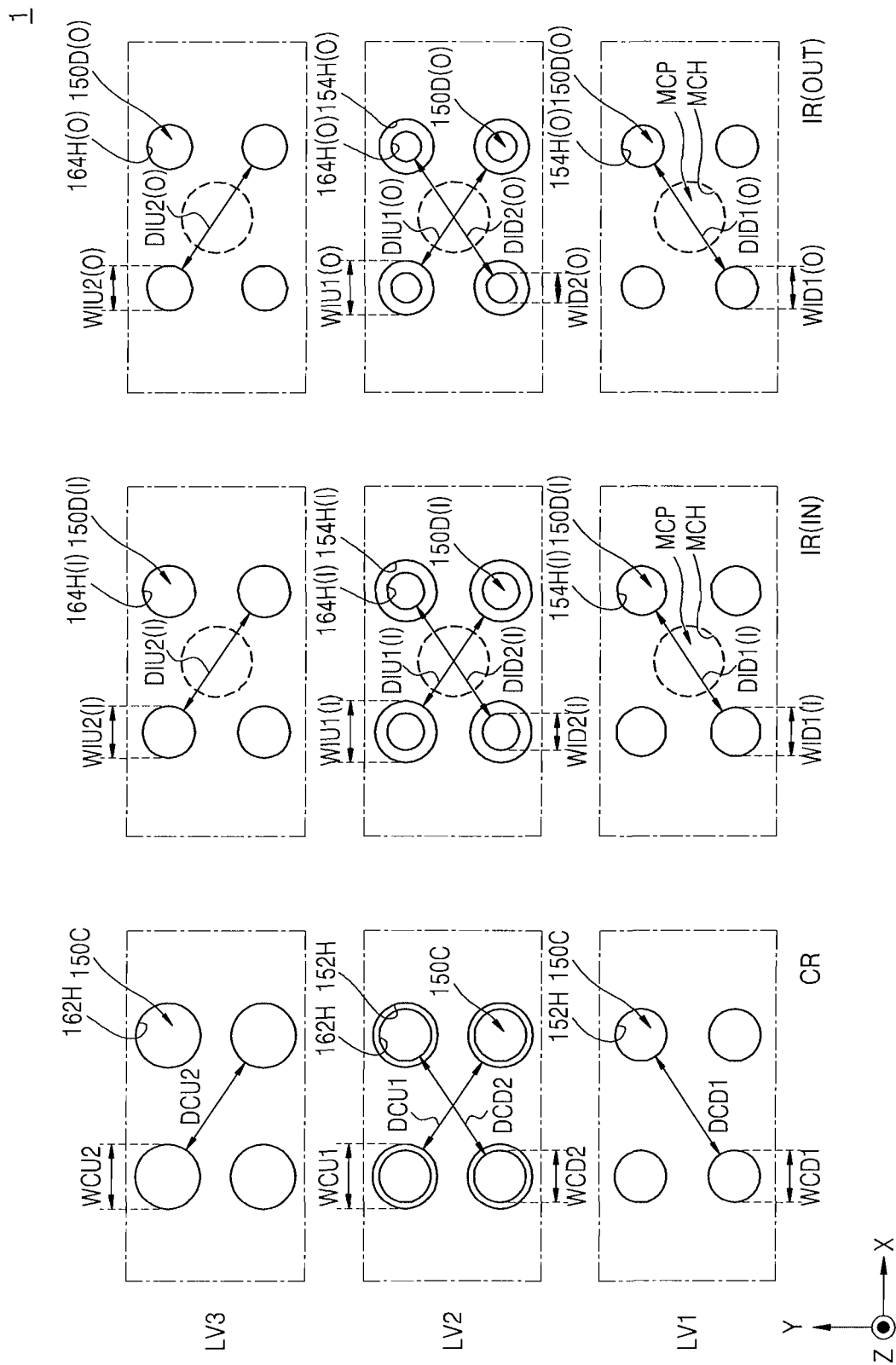
FIG. 12C illustrates a plan layout of some components of an integrated circuit device.

FIGS. 12A and 12B illustrate cross-sectional views of an integrated circuit device according to example embodiments, and FIG. 12C illustrates a plan layout of some components of the integrated circuit device.

Referring to FIGS. 12A and 12B together, a string selection line cut region SLC limited or formed by removing a portion of the second protective insulating layer 190, an upper portion of at least one of the plurality of second insulating layers 116, and an upper portion of at least one of the plurality of word line structures WS may be formed, and a cut insulating layer 196 filling the string selection line cut region SLC may be formed. The cut insulating layer 196 may include an oxide layer, a nitride layer, or a combination thereof.

Next, a first conductive stud 232 and a bit line BL on the conductive plug layer 156 included in each of the plurality of cell channel structures 150C, and an upper conductive via 234 between the first conductive stud 232 and the bit line BL, may be formed. An interlayer insulating layer 210 may surround the first conductive stud 232 and the upper conductive via 234. A plurality of the bit lines BL may have a generally constant distance from each other in the first horizontal direction (X direction) and may extend in a second horizontal direction (Y direction). In an implementation, the plurality of cell channel structures 150C may be connected to the bit lines BL through the first conductive stud 232 and the upper conductive via 234. In an implementation, according to an arrangement of the plurality of cell channel structures 150C, a horizontal width of the plurality of cell channel structures 150C, and/or a horizontal width of the bit lines BL, and the like, the plurality of cell channel structures 150C may be connected to the plurality of bit lines BL in various ways.

In the interconnection region IR, a conductive contact plug MCP may be formed that fills a contact hole MCH exposing the word line structure WS between at least two dummy channel structures 150D, and may be electrically connected to the word line structure WS. The interconnection region IR may include an inner interconnection region IR (IN) relatively close (e.g., proximate) to the cell region CR and an outer interconnection region IR (OUT) relatively far from (e.g., distal to) the cell region CR. Here, the terms of the inner interconnection region IR (IN) and the outer interconnection region IR (OUT) may be merely to compare and explain two portions in the interconnection region that have relatively different distances in the horizontal direction (for example, the first horizontal direction (X direction)) from the cell region CR, and may not indicate particular portions. In addition, for convenience of explanation, '(I)' may be added after a member number corresponding to the inner interconnection region IR (IN), and '(O)' may be added after a member number corresponding to the outer interconnection region IR (OUT). A member number to which '(I)' or '(O)' is not added may correspond to a case where it is not particularly necessary to differentiate whether the member number is in the inner interconnection region IR(IN) or the outer interconnection region IR(OUT).

The conductive contact plug MCP may extend in the vertical direction (Z direction) from the word line structure WS to which the conductive contact plug MCP is electrically connected. FIG. 12A illustrates an example in which the conductive contact plug MCP penetrates through the second protective insulating layer 190, the second filling insulating layer 174, and the first protective insulating layer 114 and is connected to one of the plurality of word line structures WS of the first stack ST1. In an implementation, the conductive contact plug MCP may be formed in various ways such that the conductive contact plug MCP is connected to one of the plurality of word line structures WS included in the second stack ST2, e.g., by penetrating through the second protective insulating layer 190, or is connected to one of the plurality of word line structures WS included in the second stack ST2 by penetrating through the second protective insulating layer 190 and the second filling insulating layer 174, or is connected to one of the plurality of word line structures WS included in the first stack ST1 by penetrating the second protective insulating layer 190, the second filling insulating layer 174, the first protective insulating layer 114, and the first filling insulating layer 172.

The conductive contact plug MCP may be electrically connected to a conductive connection wire 224 via a second conductive stud 222. The first conductive stud 232 and the second conductive stud 222 may include the same material. In an implementation, the uppermost end of the first conductive stud 232 and the uppermost end of the second conductive stud 222 may have the same level (e.g., may be the same distance from the substrate 102 in the vertical Z direction).

The conductive connection wire 224 may extend on a horizontal level closer to the substrate 102 than the bit line BL. In an implementation, the conductive connection wire 224 may extend, e.g., in the first horizontal direction (X direction). For example, the conductive connection wire 224 may extend in the first horizontal direction (X direction), be bent, and extend in the second horizontal direction (Y direction), or may extend in the second horizontal direction (Y direction), or may extend in the second horizontal direction (Y direction), be bent, and extend in the first horizontal direction (X direction).

The plurality of word line structures WS between two neighboring word line cut regions WLC may include the ground selection line GSL, the first through $n^{th}$ word lines WL1 through WLn, and the string selection line SSL. The number of word line structures WS stacked on the substrate 102 in the vertical direction (Z direction) may be variously selected as desired. The word line structure WS that is closest to the substrate 102 among the plurality of word line structures WS may constitute the ground selection line GSL. Each of two word line structures WS on the uppermost end of the plurality of word line structures WS may constitute the string selection line SSL. The string selection line SSL may include portions separated by the string selection line cut region SLC.

Referring to FIGS. 12A through 12C together, an integrated circuit device 1 may include the plurality of cell channel structures 150C filling the plurality of cell channel holes including the first cell channel hole 152H and the second cell channel hole 162H, which are communicatively connected to each other, and the plurality of dummy channel structures 150D filling the plurality of dummy channel holes including the first dummy channel hole 154H and the second dummy channel hole 164H, which are communicatively connected to each other.

The first cell channel hole 152H and the first dummy channel hole 154H may extend in the vertical direction (Z direction) from the first level LV1 to the second level LV2, and the second cell channel hole 162H and the second dummy channel hole 164H may extend in the vertical direction (Z direction) from the second level LV2 to the third level LV3.

A width of the first dummy channel hole 154H at the second level LV2, e.g., a first dummy top width WIU1, which is a width of an uppermost end of the first dummy channel hole 154H, may be greater than a width of the first dummy channel hole 154H at the first level LV1, e.g., a first dummy bottom width WID1, which is a width of a lowermost end of the first dummy channel hole 154H.

A width of the second dummy channel hole 164H at the third level LV3, e.g., a second dummy top width WIU2, which is a width of an uppermost end of the second dummy channel hole 164H, may be greater than a width of the second dummy channel hole 164H on the second level LV2, e.g., a second dummy bottom width WID2, which is a width of a lowermost end of the second dummy channel hole 164H.

The first dummy upper width WIU1 may be greater than the second dummy upper width WIU2. In an implementation, the first dummy lower width WID1 may be greater than the second dummy lower width WID2. In an implementation, according to a ratio of a height of the first stack ST1 over a height of the second stack ST2 in the vertical direction (Z direction), the first dummy lower width WID1 and the second dummy lower width WID2 may have generally the same value, and the first dummy lower width WID1 may be less than the second dummy lower width WID2.

A distance between a pair of first dummy channel holes 154H adjacent to each other with the conductive contact plug MCP therebetween (e.g., in the X direction) at the second level LV2, e.g., a first dummy top distance DIU1 that is a distance between uppermost ends of the pair of first dummy channel holes 154H adjacent to each other with the conductive contact plug MCP therebetween, may be less than a distance between the pair of first dummy channel holes 154H adjacent to each other with the conductive contact plug MCP therebetween at the first level LV1, e.g., a first dummy top distance DID1 that is a distance between lowermost ends of the pair of first dummy channel holes 154H adjacent to each other with the conductive contact plug MCP therebetween.

A distance between a pair of second dummy channel holes 164H adjacent to each other with the conductive contact plug MCP therebetween at the third level LV3, e.g., a second dummy top distance DIU2 that is a distance between uppermost ends of the pair of second dummy channel holes 164H adjacent to each other with the conductive contact plug MCP therebetween, may be less than a distance between the pair of second dummy channel holes 164H adjacent to each other with the conductive contact plug MCP therebetween at the second level LV2, e.g., a second dummy bottom distance DID2 that is a distance between lowermost ends of the pair of second dummy channel holes 164H adjacent to each other with the conductive contact plug MCP therebetween.

The second dummy upper distance DIU2 may be greater than the first dummy upper distance DIU1. The second dummy lower distance DID2 may be greater than the first dummy upper distance DIU1.

In an implementation, the second dummy lower distance DID2 may be less than the first dummy lower distance DID1. In an implementation, according to a ratio of the height of the first stack ST1 over the height of the second stack ST2 in the vertical direction (Z direction), the first dummy lower distance DID1 and the second dummy lower distance DID2 may have generally the same value, and the first dummy lower distance DID1 may be less than the second dummy lower distance DID2.

A width of the first cell channel hole 152H at the second level LV2, e.g., a first cell top width WCU1, which is a width of an uppermost end of the first cell channel hole 152H, may be greater than a width of the first cell channel hole 152H at the first level LV1, e.g., a first cell lower width WCD1, which is a width of a lowermost end of the first cell channel hole 152H.

A width of the second cell channel hole 162H at the third level LV3, e.g., a second cell top width WCU2, which is a width of an uppermost end of the second cell channel hole 162H, may be greater than a width of the second cell channel hole 162H at the second level LV2, e.g., a second cell lower width WCD2, which is a width of a lowermost end of the second cell channel hole 162H.

The first cell upper width WCU1 may be substantially the same as the second cell upper width WCU2. In an implementation, the first cell bottom width WCD1 may be substantially the same as the second cell bottom width WCD2. In an implementation, according to the ratio of the height of the first stack ST1 over the height of the second stack ST2 in the vertical direction (Z direction), the first cell lower width WCD1 may be greater than the second cell lower width WCD2, and the first cell lower width WCD1 may be less than the second cell lower width WCD2.

A distance between a pair of first cell channel holes 152H adjacent to each other in a diagonal direction at the second level LV2, e.g., an inclined direction with respect to the first horizontal direction (X direction) and the second horizontal direction (Y direction), e.g., a first cell top distance DCU1 that is a distance between the uppermost ends of the pair of first cell channel holes 152H adjacent to each other in the diagonal direction may be less than a distance between a pair of first cell channel holes 152H adjacent to each other in a diagonal direction at the first level LV1, e.g., a first cell lower distance DCD1 that is a distance between the lowermost ends of the pair of first cell channel holes 152H adjacent to each other in the diagonal direction.

A distance between a pair of second cell channel holes 162H adjacent to each other in a diagonal direction at the third level LV3, e.g., an inclined direction with respect to the first horizontal direction (X direction) and the second horizontal direction (Y direction), e.g., a second cell upper distance DCU2 that is a distance between the uppermost ends of the pair of second cell channel holes 162H adjacent to each other in the diagonal direction may be less than a distance between a pair of second cell channel holes 162H adjacent to each other in a diagonal direction at the second level LV2, e.g., a second cell lower distance DCD2 that is a distance between the lowermost ends of the pair of second cell channel holes 162H adjacent to each other in the diagonal direction.

The second cell upper distance DCU2 may be substantially the same as the first cell upper distance DCU1. In an implementation, the first cell lower distance DCD1 and the second cell lower distance DCD2 may have substantially the same value. In an implementation, according to the ratio of the height of the first stack ST1 over the height of the second stack ST2 in the vertical direction (Z direction), the first cell lower distance DCD1 may be greater than the second cell lower distance DCD2, and the first cell lower distance DCD1 may be less than the second cell lower distance DCD2.

In an implementation, the first cell upper width WCU1, the second cell upper width WCU2, the first cell lower width WCD1, and the second cell lower width WCD2 may be greater than the first dummy upper width WIU1, the second dummy upper width WIU2, the first dummy lower width WID1, and the second dummy lower width WID2, respectively.

A first dummy upper width WIU1(I), a first dummy lower width WID1(I), a second dummy upper width WIU2(I), and a second dummy lower width WID2(I) in the inner interconnection region IR(IN) may be greater than a first dummy upper width WIU1(O), a first dummy lower width WID1(O), a second dummy upper width WIU2(O), and a second dummy lower width WID2(O) in the outer interconnection region IR, respectively. For example, a first dummy channel hole 154H(I) and a second dummy channel hole 164H(I) in the inner interconnection region IR(IN) may have greater widths than a first dummy channel hole 154H(O) and a second dummy channel hole 164H(O) in the outer interconnection region IR(IN), respectively. For example, at the same level, a dummy channel structure 150D(I) in the inner interconnection region IR(IN) may have a greater diameter than a dummy channel structure 150D(O) in the outer interconnection region IR(OUT).

A first dummy upper distance DIU1(I), a first dummy lower distance DID1(I), a second dummy upper distance DIU2(I), and a second dummy lower distance DID2(I) in the inner interconnection region IR(IN) may be less than a first dummy upper distance DIU1(O), a first dummy lower distance DID1(O), a second dummy upper distance DIU2(O), and a second dummy lower distance DID2(O) in the outer interconnection region IR, respectively.

In the integrated circuit device 1 according to embodiments, by forming the second dummy upper width WIU2 to be less than the first dummy upper width WIU1, the second dummy upper distance DIU2 may be greater than the first dummy upper distance DIU1. For example, an area at the third level LV3 for forming the contact hole MCH filling the conductive contact plug MCP, e.g., an area between the dummy channel structures 150D may be secured, and a process margin for forming the contact hole MCH and the conductive contact plug MCP may increase.

In addition, in the integrated circuit device 1 according to embodiments, the first dummy upper width WIU1 may be greater than the second dummy upper width WIU2, and, in a process of forming the second dummy channel hole 164H on the first dummy channel hole 154H, a misalignment between the first dummy channel hole 154H and the second dummy channel hole 164H communicatively connected to each other may be prevented. For example, a bridge between the word line structures WS that could otherwise be generated when the misalignment occurs between the first dummy channel hole 154H and the second dummy channel hole 164H that are communicatively connected to each other, may be prevented.

In addition, in the integrated circuit device 1 according to embodiments, the first dummy upper distance DIU1(I), the first dummy lower distance DID(I), the second dummy upper distance DIU2(I), and the second dummy lower distance DIU2(I) in the inner interconnection region IR(IN) may be greater than the first dummy upper distance DIU1 (O), the first dummy lower distance DID(O), the second dummy upper distance DIU2(O), and the second dummy lower distance DIU2(O) in the outer interconnection region IR(OUT), respectively, and a process margin for forming the contact hole MCH and the conductive contact plug MCP that are formed at a relatively far distance from the cell region CR may increase.

Figure 13:
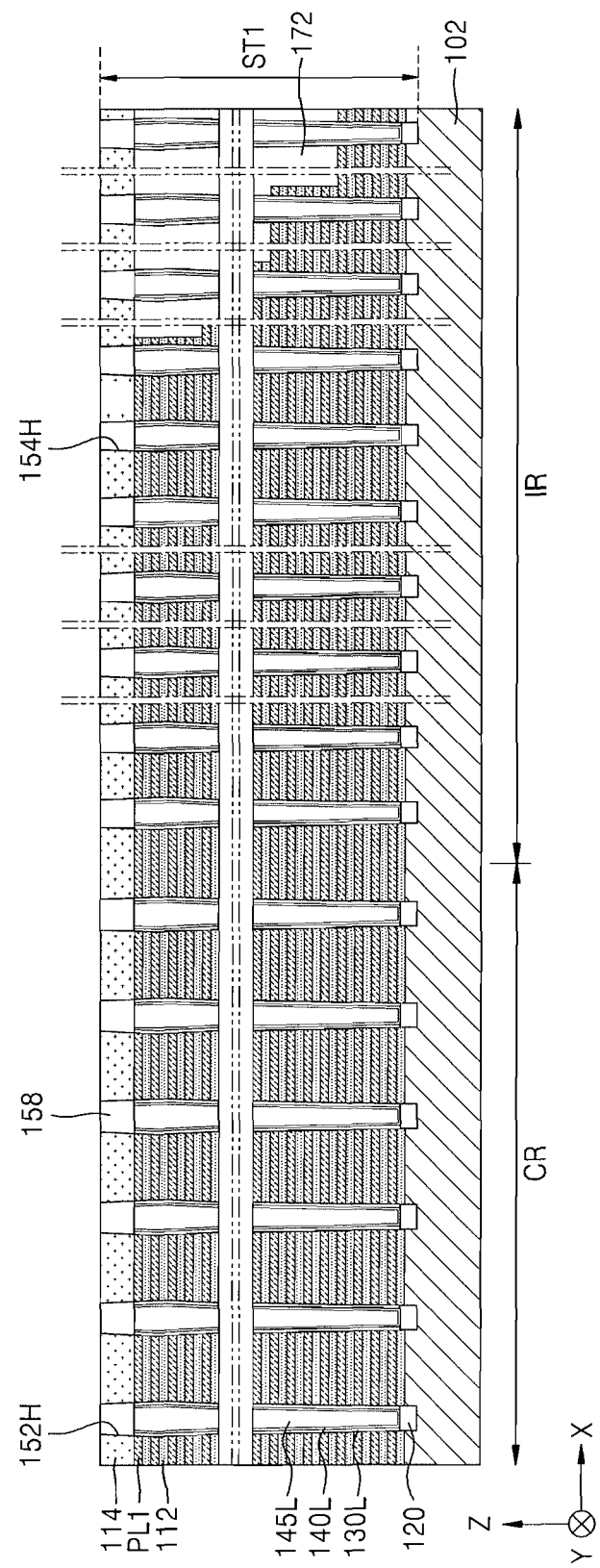
FIGS. 13 and 14 illustrate cross-sectional views of stages in a fabrication method of an integrated circuit device according to example embodiments.
Figure 14:
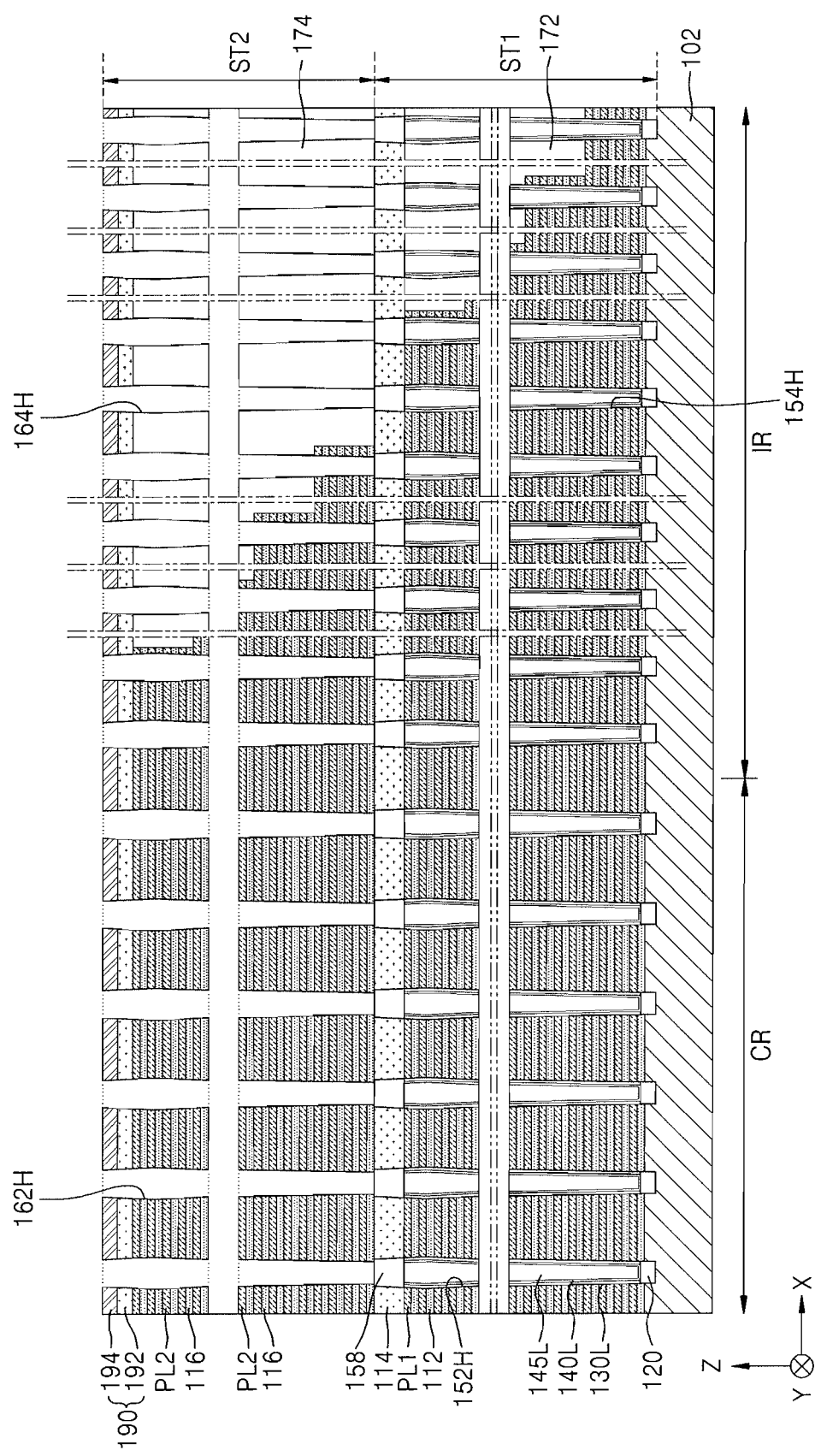

FIGS. 13 and 14 illustrate cross-sectional views of stages in a fabrication method of the integrated circuit device according to example embodiments. FIG. 13 illustrates a cross-sectional view of a stage after the operation illustrated in FIG. 3, and repeated descriptions already given with respect to FIGS. 1 through 11B may be omitted from the descriptions to be given with respect to FIGS. 13 and 14.

Referring to FIG. 13, the semiconductor pattern 120, a lower charge storage structure 130L, a lower channel layer 140L, a lower filling insulating layer 145L, and a connection conductive plug layer 158 may be formed in each of the plurality of first cell channel holes 152H and each of the plurality of first dummy channel holes 154H.

Except for filling each of the plurality of first cell channel holes 152H and each of the plurality of first cell channel holes 152H, the semiconductor pattern 120, the lower charge storage structure 130L, the lower channel layer 140L, the lower filling insulating layer 145L, and the connection conductive plug layer 158 may be generally similar to the semiconductor pattern 120, the charge storage structure 130, the channel layer 140, the filling insulating layer 145, and the conductive plug layer 156, which fill each of the plurality of cell channel structures 150C and each of the plurality of dummy channel structures 150D described with respect to FIG. 8.

Referring to FIG. 14, similar to the method described with reference to FIGS. 5 through 7, a structure in which the plurality of second insulating layers 116 and the plurality of sacrificial layers PL2 are alternately stacked one by one on the first stack ST1 in the cell region CR and the interconnection region IR may be formed, by removing a portion of the structure in which the plurality of second insulating layers 116 and the plurality of second sacrificial layers PL2 are alternately stacked one by one in the interconnection region IR, e.g., by removing a portion of the second preliminary stacked structure, the edge portions of the second preliminary stacked structure may be formed to have a stepwise structure, the second filling insulating layer 174 may be formed at a portion where the portion of the second preliminary stacked structure has been removed, and the second protective insulating layer 190 covering the second preliminary stacked structure and the second filling insulating layer 174 in the cell region CR and the interconnection region IR may be formed. Next, in the cell region CR, a plurality of second cell channel holes 162H penetrating through the plurality of second insulating layers 116 and the plurality of second sacrificial layers PL2 may be formed, and in the interconnection region IR, a plurality of second dummy channel holes 164H penetrating through the second filling insulating layer 177, the plurality of second insulating layers 116, and the plurality of second sacrificial layers PL2 may be formed. The connection conductive plug layer 158 may be exposed at the bottom surfaces of the plurality of second cell channel holes 162H and the plurality of second dummy channel holes 164H.

Unlike the mold layer (108 in FIG. 6) filling the plurality of first cell channel holes 152H and the plurality of first dummy channel holes 154H is removed in FIG. 7, the semiconductor pattern 120, the lower charge storage structure 130L, the lower channel layer 140L, the lower filling insulating layer 145L, and the connection conductive plug layer 158, which fill the plurality of first cell channel holes 152H and the plurality of first dummy channel holes 154H, may not be removed.

Figure 15:
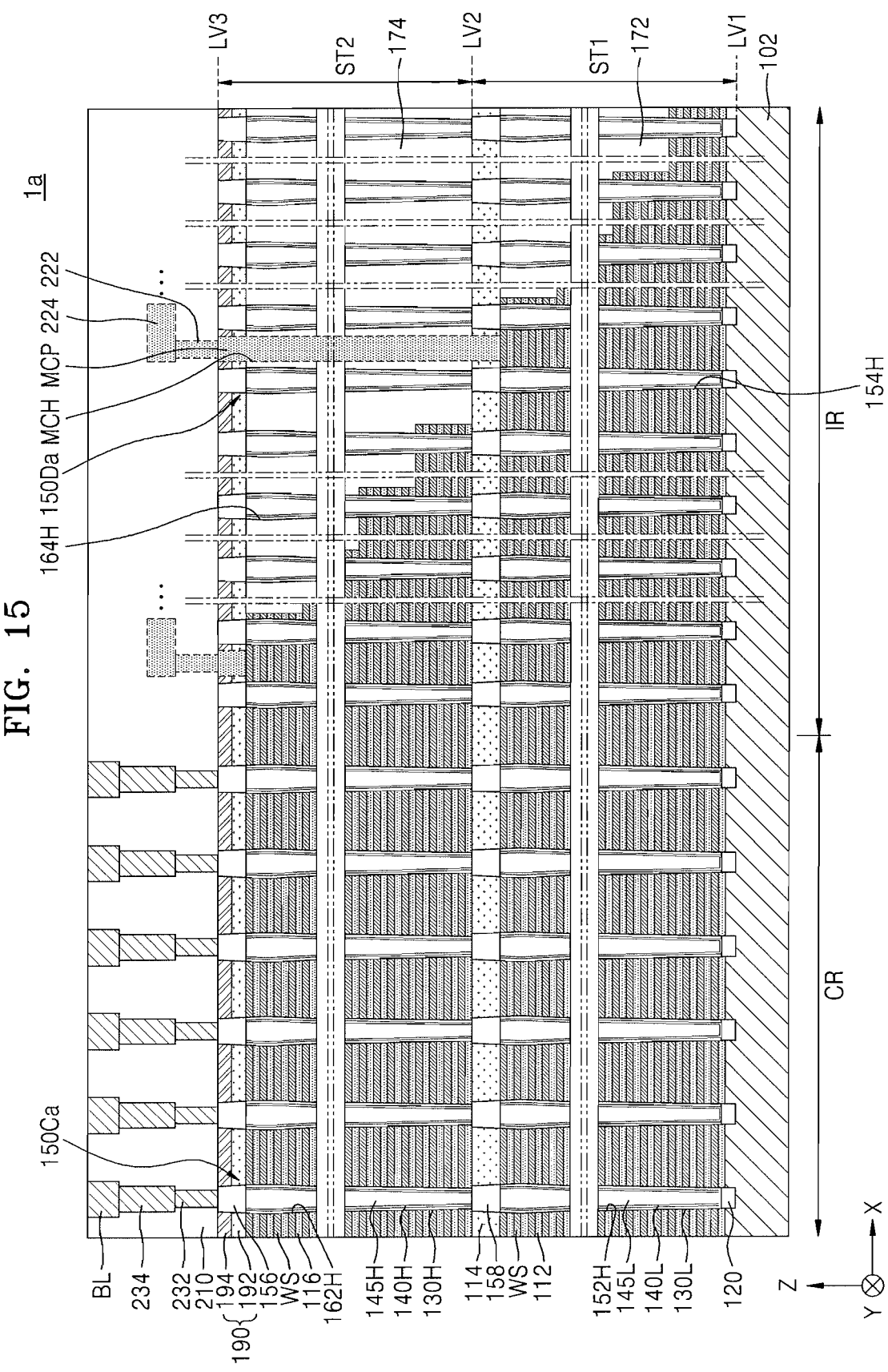
FIG. 15 illustrates a cross-sectional view of an integrated circuit device according to example embodiments.

FIG. 15 illustrates a cross-sectional view of an integrated circuit device according to example embodiments.

Referring to FIG. 15, an upper charge storage structure 130H, an upper channel layer 140H, and an upper filling insulating layer 145H may be arranged in each of the plurality of second cell channel holes 162H and each of the plurality of second dummy channel holes 164H. Except for filling each of the plurality of first cell channel holes 152H and each of the plurality of first cell channel holes 152H, the upper charge storage structure 130H, the upper channel layer 140H, the upper filling insulating layer 145H, and the conductive plug layer 156 may be generally similar to the charge storage structure 130, the channel layer 140, the filling insulating layer 145, and the conductive plug layer 156, which fill each of the plurality of cell channel structures 150C and each of the plurality of dummy channel structures 150D, respectively.

Each of a plurality of cell channel structures 150Ca filling the plurality of second cell channel holes 162H and the plurality of first cell channel holes 152H, and each of a plurality of dummy channel structures 150Da filling the plurality of second dummy channel holes 164H and the plurality of first dummy channel holes 154H may include the semiconductor pattern 120, the lower charge storage structure 130L, the lower channel layer 140L, the lower filling insulating layer 145L, and the connection conductive plug layer 158, which fill each of the plurality of first cell channel holes 152H and each of the plurality of first dummy channel holes 154H, and the upper charge storage structure 130H, the upper channel layer 140H, the upper filling insulating layer 145H, and the conductive plug layer 156, which fill each of the plurality of second cell channel holes 162H and each of the plurality of second dummy channel holes 164H. The lower channel layer 140L may contact the semiconductor pattern 120, and may be electrically connected to the upper channel layer 140H via the connection conductive plug layer 158.

The integrated circuit device 1 illustrated in FIGS. 12A through 12C and the integrated circuit device 1a illustrated in FIG. 15 may be generally the same except configurations of the plurality of cell channel structures 150C and the plurality of dummy channel structures 150D included in the integrated circuit device 1, and configurations of the plurality of cell channel structures 150Ca and the plurality of dummy channel structures 150D included in the integrated circuit device 1a, and thus, a repeated detailed description thereof may be omitted.

Figure 16:
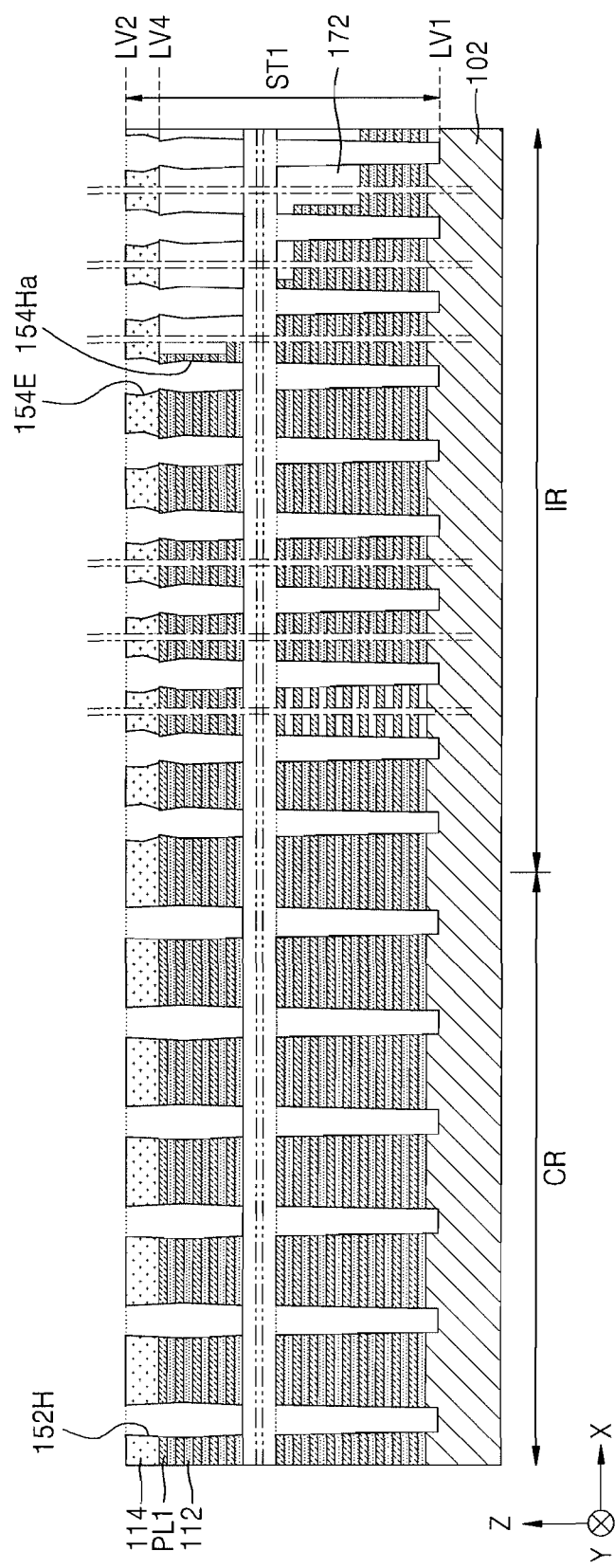
FIG. 16 illustrates a cross-sectional view of an integrated circuit device according to example embodiments.

FIG. 16 illustrates a cross-sectional view of an integrated circuit device according to example embodiments. FIG. 16 illustrates a cross-sectional view of a stage after the operation illustrated in FIG. 3, and descriptions already given with respect to FIGS. 1 through 11B may be omitted from the descriptions to be given with respect to FIG. 16.

Referring to FIG. 16, by removing a portion of the first protective insulating layer 114 in the interconnection region IR, a plurality of first dummy channel holes 154Ha may be formed that have been expanded such that a width of an upper portion thereof is greater than a width of the remaining portion thereof with respect to the plurality of first dummy channel holes 154H illustrated in FIG. 3. An upper portion that is limited or defined by the first protective insulating layer 114 and having a greater width than the remaining portion among the plurality of first dummy channel holes 154Ha may be referred to as an expansion dummy hole 154E.

Figure 17A:
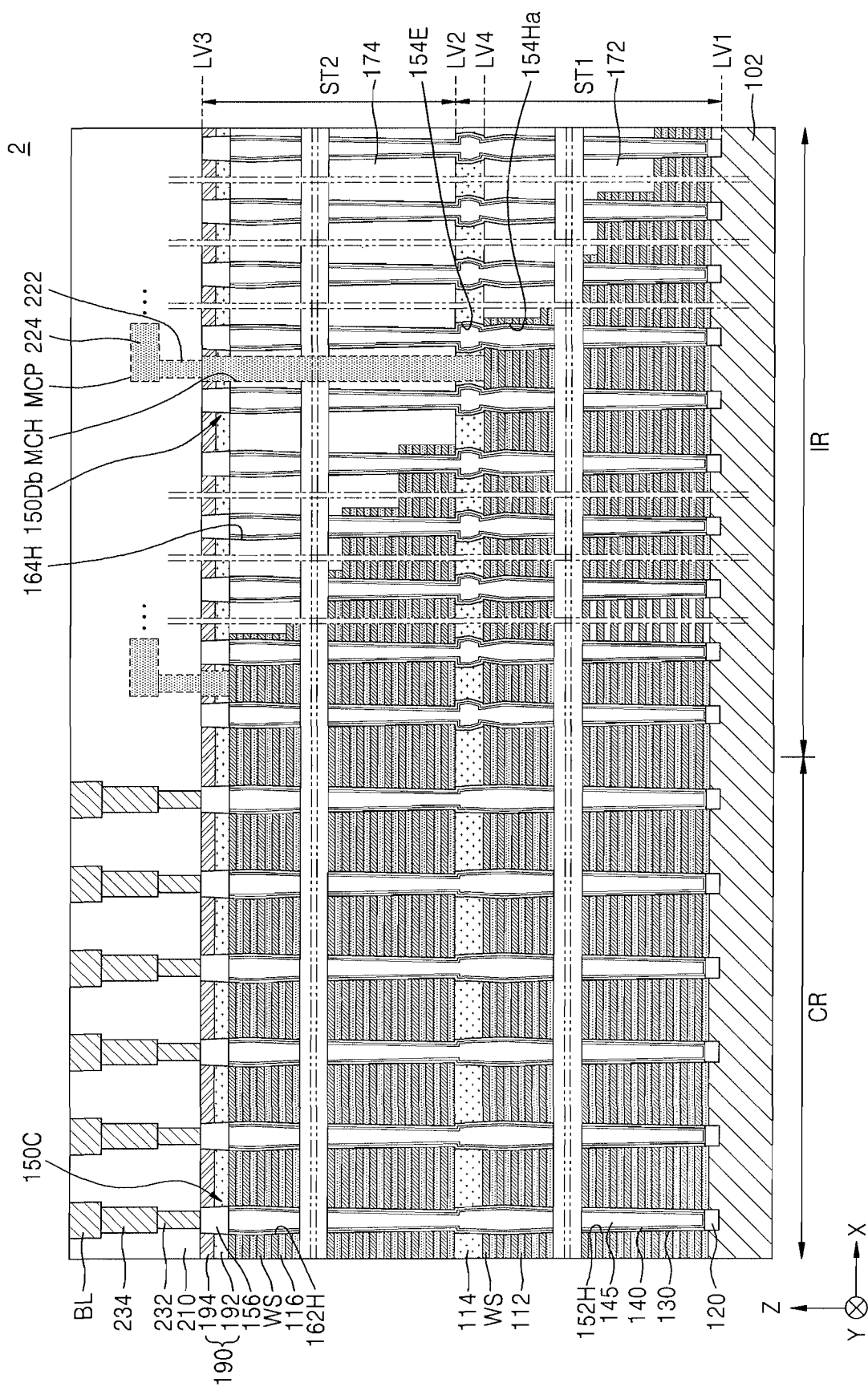
FIG. 17A illustrates a cross-sectional view of an integrated circuit device according to example embodiments.
Figure 17B:
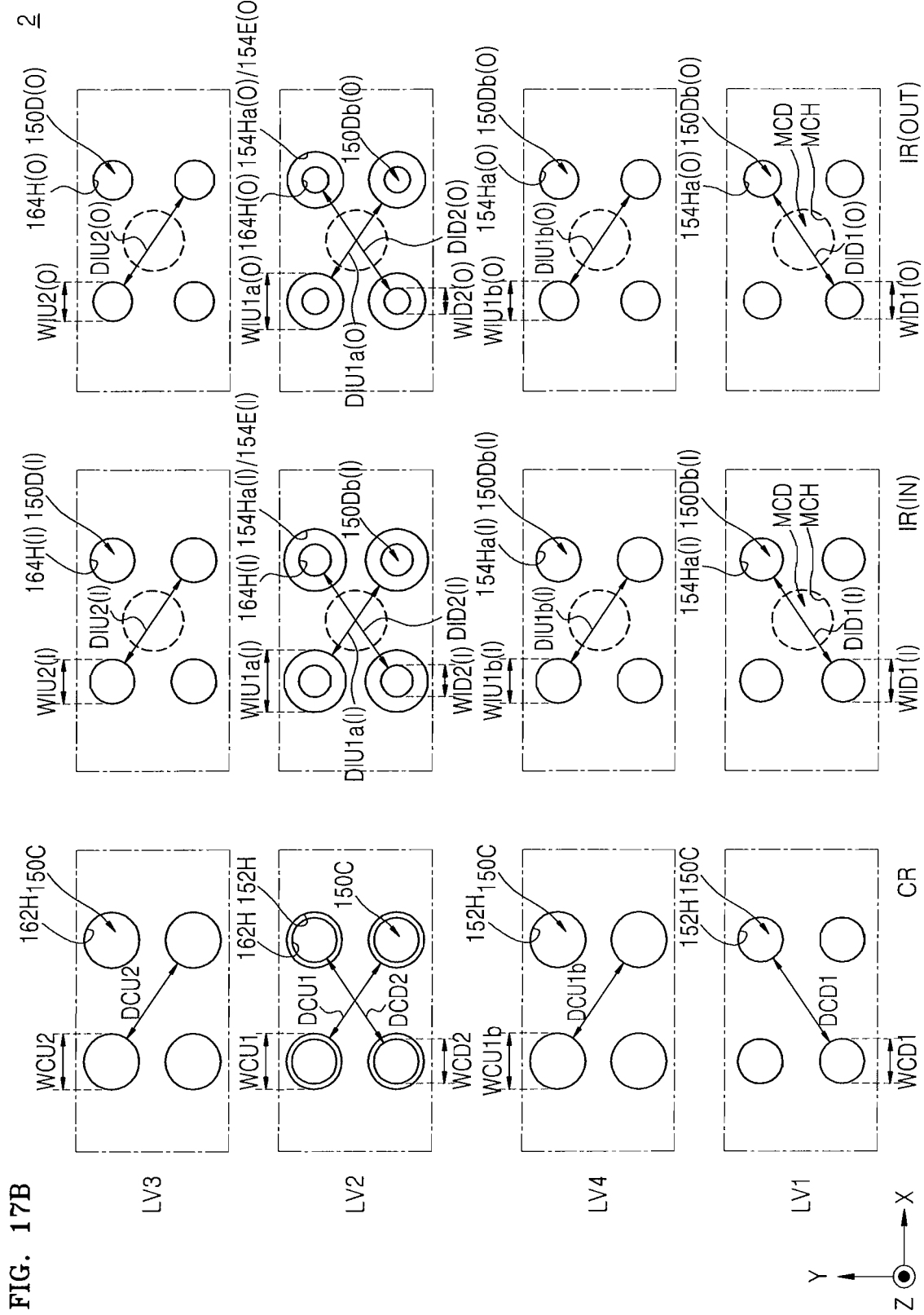
FIG. 17B illustrates a plan layout of some components of the integrated circuit device.

FIG. 17A illustrates a cross-sectional view of an integrated circuit device according to example embodiments, and FIG. 17B illustrates a plan layout of some components of the integrated circuit device 2.

Referring to FIG. 17A, the integrated circuit device 2 may be formed by performing a method similar to the method described with reference to FIGS. 4 through 12B.

The integrated circuit device 2 illustrated in FIG. 17A may be generally similar to the integrated circuit device 1 illustrated in FIGS. 12A and 12B, except that the integrated circuit device 2 may include a plurality of dummy channel structures 150Db filling a plurality of dummy channel holes including the first dummy channel hole 154Ha and a second dummy channel hole 164H that are communicatively connected to each other, instead of the plurality of dummy channel structure 150D filling the plurality of dummy channel holes including the first dummy channel hole 154H and the second dummy channel hole 164H that are communicatively connected to each other.

Referring to FIGS. 17A and 17B together, the integrated circuit device 2 may include the plurality of cell channel structures 150C filling the plurality of cell channel holes including the first cell channel holes 152H and the second cell channel hole 162H, which are communicatively connected to each other, and the plurality of dummy channel structures 150Db filling the plurality of dummy channel holes including the first dummy channel holes 154Ha and the second dummy channel holes 164H, which are communicatively connected to each other. The first dummy channel hole 154Ha may include the expansion dummy hole 154E limited by the first protective insulating layer 114 at an upper portion of the first dummy channel hole 154Ha.

The first cell channel hole 152H and the first dummy channel hole 154Ha may extend in the vertical direction (Z direction) from the first level LV1 to the second level LV2, and the second cell channel hole 162H and the second dummy channel hole 164H may extend in the vertical direction (Z direction) from the second level LV2 to the third level LV3.

A width of the first dummy channel hole 154Ha at the second level LV2, e.g., a first dummy top width WIU1a, which is a width of an uppermost end of the first dummy channel hole 154Ha, may be greater than a width of the first dummy channel hole 154Ha at the first level LV1, e.g., a first dummy lower width WID1, which is a width of a lowermost end of the first dummy channel hole 154Ha. A width of the second dummy channel hole 164H at the third level LV3, e.g., a second dummy upper width WIU2, which is a width of an uppermost end of the second dummy channel hole 164H, may be greater than a width of the second dummy channel hole 164H at the second level LV2, e.g., a second dummy lower width WID2, which is a width of a lowermost end of the second dummy channel hole 164H. At a fourth level LV4, a width of the first dummy channel hole 154Ha, e.g., a width WIU1b at the same level as the bottom surface of the first protective insulating layer 114 of the first dummy channel hole 154Ha may be greater than the first dummy lower width WID1 and less than the first dummy upper width WIU1a.

The first dummy upper width WIU1a may be greater than the second dummy upper width WIU2. In an implementation, the first dummy lower width WID1 may be greater than the second dummy lower width WID2. In an implementation, according to the ratio of the height of the first stack ST1 over the height of the second stack ST2 in the vertical direction (Z direction), the first dummy lower width WID1 and the second dummy lower width WID2 may have generally the same value, and the first dummy lower width WID1 may be less than the second dummy lower width WID2.

A distance between a pair of first dummy channel holes 154Ha adjacent to each other with the conductive contact plug MCP therebetween at the second level LV2, e.g., a first dummy upper distance DIU1a that is a distance between uppermost ends of the pair of first dummy channel holes 154Ha adjacent to each other with the conductive contact plug MCP therebetween may be less than a distance between the pair of first dummy channel holes 154Ha adjacent to each other with the conductive contact plug MCP therebetween at the first level LV1, e.g., the first dummy upper distance DID1 that is a distance between lowermost ends of the pair of first dummy channel holes 154Ha adjacent to each other with the conductive contact plug MCP therebetween. A distance between a pair of second dummy channel holes 164H adjacent to each other with the conductive contact plug MCP therebetween at the third level LV3, e.g., a second dummy upper distance DIU2 that is a distance between uppermost ends of the pair of second dummy channel holes 164H adjacent to each other with the conductive contact plug MCP therebetween may be less than a distance between the pair of second dummy channel holes 164H adjacent to each other with the conductive contact plug MCP therebetween at the second level LV2, e.g., a second dummy lower distance DID2 that is a distance between lowermost ends of the pair of second dummy channel holes 164H adjacent to each other with the conductive contact plug MCP therebetween. At the fourth level LV4, a distance between the pair of adjacent first dummy channel holes 154Ha with the conductive contact plugs MCP therebetween, e.g., a distance DIU1$b$ of the pair of adjacent first pairs with the conductive contact plugs MCP therebetween at the same level as the bottom surface of the first protective insulating layer 114, may be less than the first dummy lower distance DID1 and greater than the first dummy upper distance DIU1$a$.

The second dummy upper distance DIU2 may be greater than the first dummy upper distance DIU1$a$. The second dummy lower distance DID2 may be greater than the first dummy upper distance DIU1$a$. In an implementation, the second dummy lower distance DID2 may be less than the first dummy lower distance DID1. In an implementation, according to the ratio of the height of the first stack ST1 over the height of the second stack ST2 in the vertical direction (Z direction), the first dummy lower distance DID1 and the second dummy lower distance DID2 may have generally the same value, and the first dummy lower distance DID1 may be less than the second dummy lower distance DID2.

At each of the first level LV1, the second level LV2, and the third level LV3, the width of the first cell channel hole 152H, the width of the second cell channel hole 162H, and the distance between the pair of first cell channel holes 152H adjacent to each other in the diagonal direction, and the distance between the pair of second cell channel holes 162H adjacent to each other in the diagonal direction may be substantially the same as those described with reference to FIG. 12C, and repeated detailed descriptions thereof may be omitted.

At the fourth level LV4, the width of the first dummy channel hole 154H, e.g., a width WCU1$b$ at the same level as the bottom surface of the first protective insulating layer 114 of the first dummy channel hole 154H may be greater than the first dummy lower width WCD1 and equal to or less than the first dummy upper width WCU1.

The distance between the pair of first cell channel holes 152H adjacent to each other in the diagonal direction at the fourth level LV4, e.g., in an inclined direction with respect to the first horizontal direction (X direction) and the second horizontal direction (Y direction), e.g., a distance DCU1$b$ of the pair of first cell channel holes 152H adjacent to each other in the diagonal direction at the same level as the bottom surface of the first protective insulating layer 114 may be less than the first cell lower distance DCD1 and equal to or greater than the first upper distance DCU1.

A first dummy upper width WIU1$a$(I), a first dummy lower width WID1(I), a second dummy upper width WIU2(I), and a second dummy lower width WID2(I), and a width WIU1$b$(I) of a first dummy channel hole 154Ha(I) at the fourth level LV4 in the inner interconnection region IR(IN) may be greater than a first dummy upper width WIU1$a$(O), a first dummy lower width WID1(O), a second dummy upper width WIU2(O), and a second dummy lower width WID2(O), and a width WIU1$b$(O) of a first dummy channel hole 154Ha(O) at the fourth level LV4 in the inner interconnection region IR(IN), respectively. For example, a first dummy channel hole 154Ha(I) and a second dummy channel hole 164H(I) in the inner interconnection region IR(IN) may have greater widths than a first dummy channel hole 154Ha(O) and a second dummy channel hole 164H(O) in the outer interconnection region IR(IN), respectively. For example, at the same level, a dummy channel structure 150Db(I) in the inner interconnection region IR(IN) may have a greater diameter than a dummy channel structure 150Db(O) in the outer interconnection region IR(OUT).

A first dummy upper distance DIU1$a$(I), a first dummy lower distance DID1(I), a second dummy upper distance DIU2(I), a second dummy lower distance DID2(I), and a distance DIU1$b$(I) between a pair of first dummy channel holes 154Ha(I) adjacent to each other with the conductive contact plug MCP therebetween at the fourth level LV4 in the inner interconnection region IR(IN) may be less than a first dummy upper distance DIU1$a$(O), a first dummy lower distance DID1(O), a second dummy upper distance DIU2(O), a second dummy lower distance DID2(O), and a distance DIU1$b$(O) between a pair of first dummy channel holes 154Ha(O) adjacent to each other with the conductive contact plug MCP therebetween at the fourth level LV4 in the inner interconnection region IR(IN), respectively.

Figure 18:
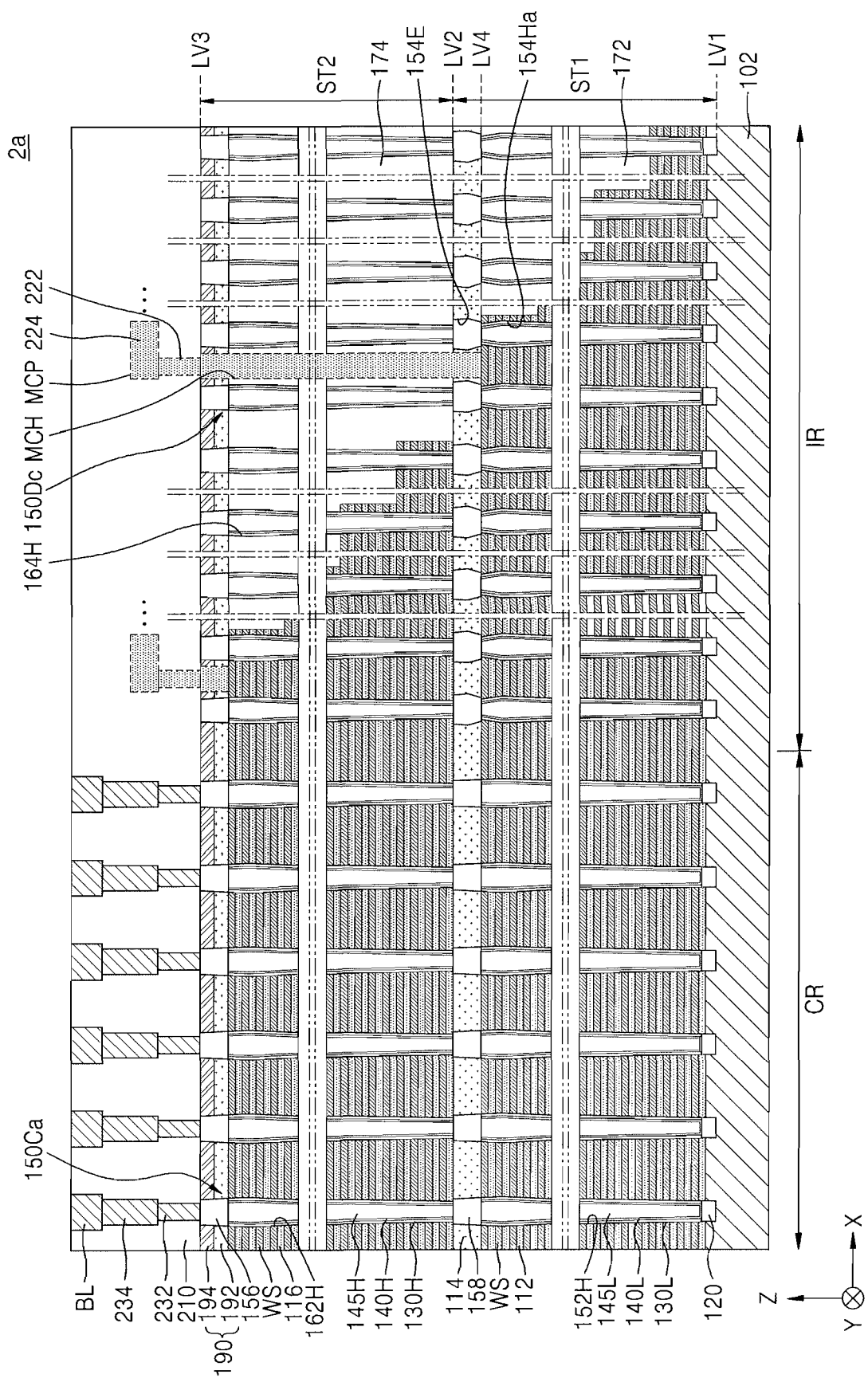
FIG. 18 illustrates a cross-sectional view of an integrated circuit device according to example embodiments.

FIG. 18 illustrates a cross-sectional view of an integrated circuit device according to example embodiments.

Referring to FIG. 18, the integrated circuit device 2$a$ may be generally similar to the integrated circuit device 1$a$ illustrated in FIG. 15, except that the integrated circuit device 2$s$ includes a plurality of dummy channel structures 150Dc filling a plurality of dummy channel holes including a first dummy channel hole 154Ha and the second dummy channel hole 164H that are communicatively connected to each other, instead of the plurality of dummy channel structure 150Da filling the plurality of dummy channel holes including the first dummy channel hole 154H and the second dummy channel hole 164H that are communicatively connected to each other.

Each of the plurality of dummy channel structures 150Dc may be similar to each of the plurality of dummy channel structures 150Da illustrated in FIG. 15 except that the connection conductive plug layer 158 may be formed in the expansion dummy hole 154E, and a repeated detailed description thereof may be omitted.

Figure 19:
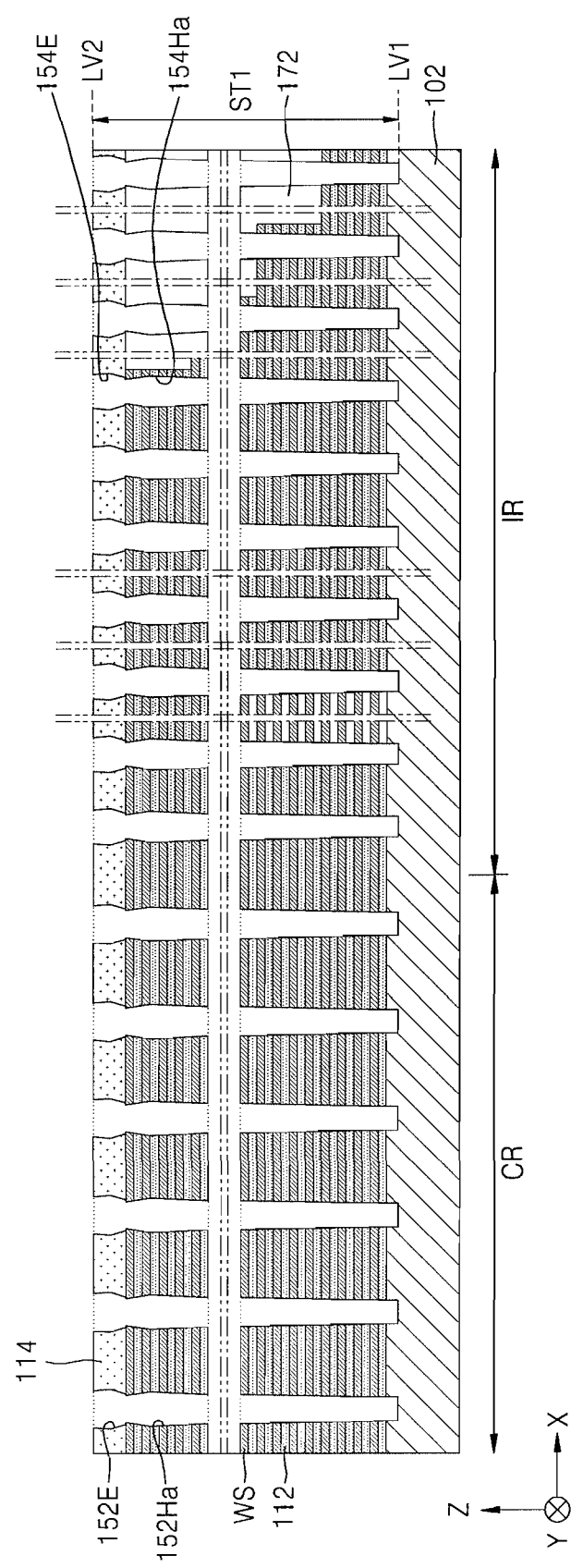
FIG. 19 illustrates a cross-sectional view of a stage in a fabrication method of an integrated circuit device according to example embodiments.

FIG. 19 illustrates a cross-sectional view of an integrated circuit device according to example embodiments. FIG. 19 illustrates a cross-sectional view of a stage after the operation illustrated in FIG. 3, and repeated descriptions already given with respect to FIGS. 1 through 11B may be omitted from the descriptions to be given with respect to FIG. 19.

Referring to FIG. 19, by removing a portion of the first protective insulating layer 114 in the cell region CR and the interconnection region IR, a plurality of first cell channel holes 152Ha in which a width of an upper portion thereof is greater than a width of the remaining portion thereof with respect to the plurality of first cell channel holes 152H, and a plurality of first dummy channel holes 154Ha in which a width of an upper portion thereof is expanded with respect to the plurality of first dummy channel holes 154H may be formed. An upper portion of the plurality of first cell channel holes 152Ha defined by the first protective insulating layer 114 and having a width greater than the remaining portion may be referred to as an expansion cell hole 152E, and an upper portion of the plurality of first dummy channel holes 154Ha limited by the first protective insulating layer 114 and having a width greater than the remaining portion may be referred to as the expansion dummy hole 154E.

Figure 20A:
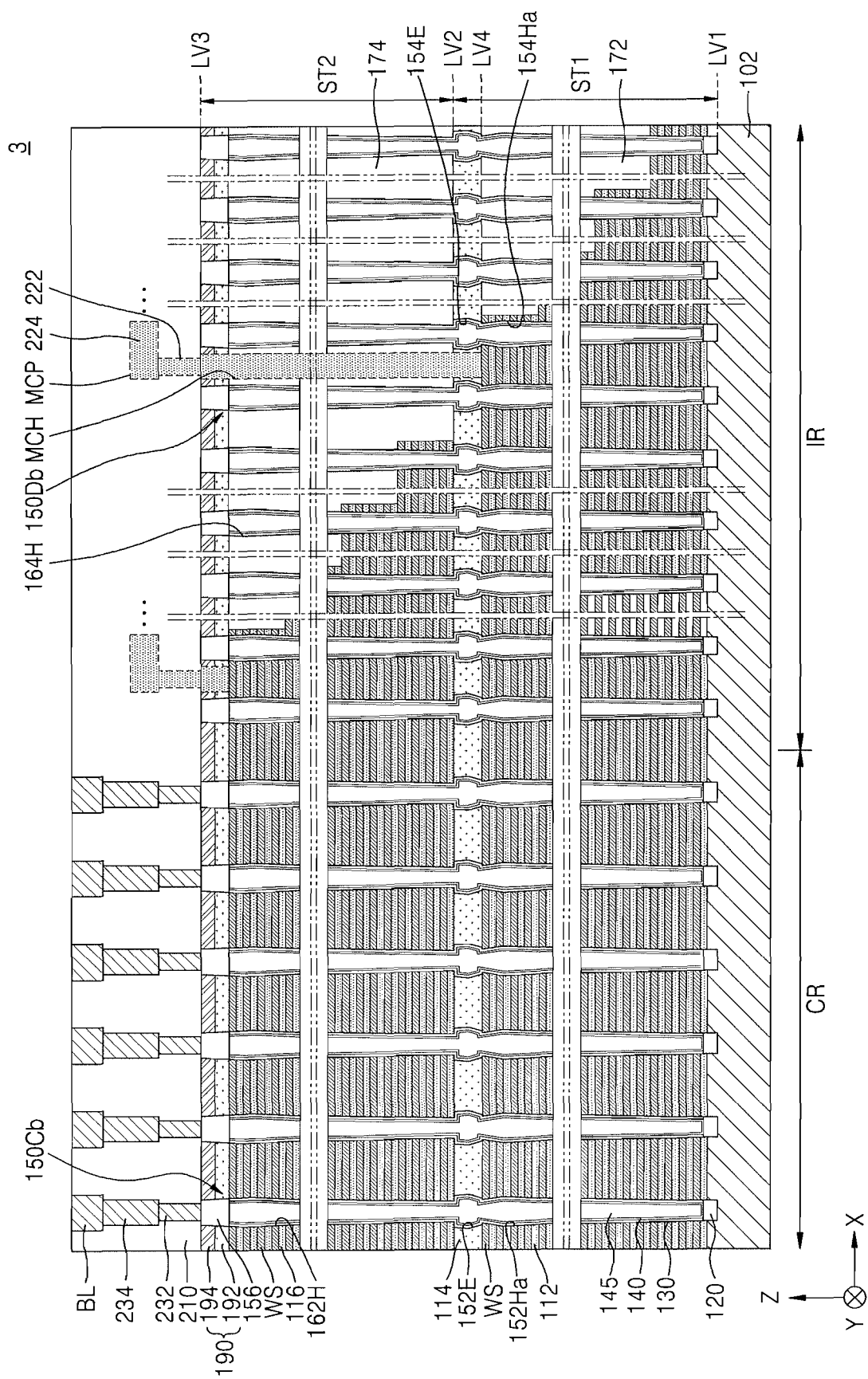
FIG. 20A illustrates a cross-sectional view of an integrated circuit device according to example embodiments.
Figure 20B:
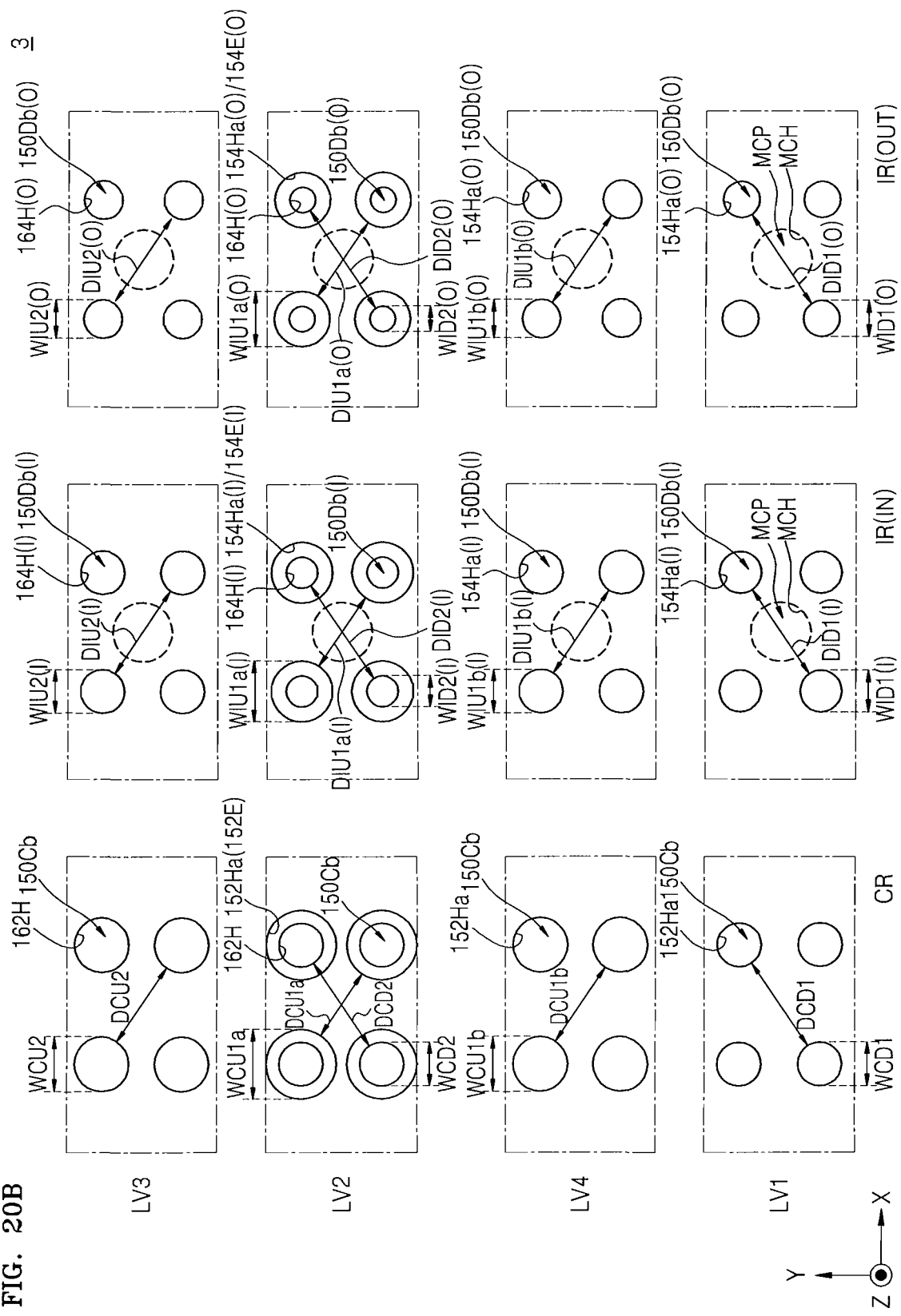
FIG. 20B illustrates a plan layout of some components of the integrated circuit device.

FIG. 20A illustrates a cross-sectional view of an integrated circuit device according to example embodiments, and FIG. 20B illustrates a plan layout of some components of the integrated circuit device of FIG. 20A.

Referring to FIG. 20A, the integrated circuit device 3 may be formed by performing a method similar to the method described with reference to FIGS. 4 through 12B.

The integrated circuit device 3 illustrated in FIG. 20A is generally similar to the integrated circuit device 2 illustrated in FIG. 17A, except that the integrated circuit device 3 may include a plurality of cell channel structures 150Cb filling a plurality of dummy channel holes including the first cell channel hole 152Ha and the second cell channel hole 162H that are communicatively connected to each other, instead of the plurality of cell channel structure 150C filling the plurality of dummy channel holes including the first cell channel hole 152H and the second cell channel hole 162H that are communicatively connected to each other. For example, repeated descriptions to be given with respect to FIGS. 20A and 20B which are the same as those given with respect to FIGS. 17A and 17B may be omitted.

Referring to FIGS. 20A and 20B together, the integrated circuit device 3 may include the plurality of cell channel structures 150Cb filling the plurality of cell channel holes including the first cell channel hole 152Ha and the second cell channel hole 162H, which are communicatively connected to each other, and the plurality of dummy channel structures 150Db filling the plurality of dummy channel holes including the first dummy channel hole 154Ha and the second dummy channel hole 164H, which are communicatively connected to each other. The first cell channel hole 152Ha and the first dummy channel hole 154Ha may include, at upper portions thereof, the expansion cell hole 152E and the expansion dummy hole 154E limited by the first protective insulating layer 114, respectively.

The first cell channel hole 152Ha and the first dummy channel hole 154Ha may extend in the vertical direction (Z direction) from the first level LV1 to the second level LV2, and the second cell channel hole 162H and the second dummy channel hole 164H may extend in the vertical direction (Z direction) from the second level LV2 to the third level LV3.

At each of the first level LV1, the second level LV2, the third level LV3, and the fourth level LV4, the width of the first dummy channel hole 154Ha, the width of the second dummy channel hole 164H, the distance between the pair of first dummy channel holes 154Ha adjacent to each other with the conductive contact plug MCP therebetween, and the distance between the pair of second dummy channel holes 164H adjacent to each other with the conductive contact plug MCP therebetween may be substantially the same as those described with reference to FIG. 17B, and repeated detailed descriptions thereof may be omitted.

A width of the first cell channel hole 152Ha at the second level LV2, e.g., a first cell upper width WCU1$a$, which is a width of an uppermost end of the first cell channel hole 152Ha, may be greater than a width of the first cell channel hole 152Ha at the first level LV1, e.g., a first cell lower width WCD1, which is a width of a lowermost end of the first cell channel hole 152Ha.

The width of the second cell channel hole 162H at the third level LV3, e.g., the second cell upper width WCU2, which is the width of the uppermost end of the second cell channel hole 162H, may be greater than the width of the second cell channel hole 162H at the second level LV2, e.g., the second cell lower width WCD2, which is the width of the lowermost end of the second cell channel hole 162H.

At the fourth level LV4, a width of the first dummy channel hole 154Ha, e.g., the width WCU1$b$ at the same level as the bottom surface of the first protective insulating layer 114 of the first dummy channel hole 154H may be greater than the first dummy lower width WCD1 and less than the first dummy upper width WCU1$a$.

The first cell upper width WCU1$a$ may be greater than the second cell upper width WCU2. In an implementation, the first cell lower width WCD1 and the second cell lower width WCD2 may have generally the same value. In an implementation, according to the ratio of the height of the first stack ST1 over the height of the second stack ST2 in the vertical direction (Z direction), the first cell lower width WCD1 may be greater than the second cell lower width WCD2, and the first cell lower width WCD1 may be less than the second cell lower width WCD2.

A distance between a pair of first cell channel holes 152Ha adjacent to each other in a diagonal direction at the second level LV2, e.g., in an inclined direction with respect to the first horizontal direction (X direction) and the second horizontal direction (Y direction), e.g., a first cell upper distance DCU1$a$ that is a distance between the uppermost ends of the pair of first cell channel holes 152Ha adjacent to each other in the diagonal direction may be less than a distance between a pair of first cell channel holes 152Ha adjacent to each other in the diagonal direction at the first level LV1, e.g., a first cell lower distance DCD1 that is a distance between the lowermost ends of the pair of first cell channel holes 152Ha adjacent to each other in the diagonal direction.

A distance between a pair of second cell channel holes 162H adjacent to each other in the diagonal direction at the third level LV3, e.g., in an inclined direction with respect to the first horizontal direction (X direction) and the second horizontal direction (Y direction), e.g., a second cell upper distance DCU2 that is a distance between the uppermost ends of the pair of first cell channel holes 162H adjacent to each other in the diagonal direction may be less than a distance between a pair of second cell channel holes 162H adjacent to each other in the diagonal direction at the second level LV2, e.g., a second cell lower distance DCD2 that is a distance between the lowermost ends of the pair of second cell channel holes 162H adjacent to each other in the diagonal direction.

The distance between the pair of first cell channel holes 152Ha adjacent to each other in the diagonal direction at the fourth level LV4, e.g., in an inclined direction with respect to the first horizontal direction (X direction) and the second horizontal direction (Y direction), e.g., a distance DCU1$b$ of the pair of first cell channel holes 152Ha adjacent to each other in the diagonal direction at the same level as the bottom surface of the first protective insulating layer 114 may be less than the first cell lower distance DCD1 and greater than the first upper distance DCU1$a$.

The second cell upper distance DCU2 may be greater than the first cell upper distance DCU1. In an implementation, the first cell bottom distance DCD1 and the second cell bottom distance DCD2 may have substantially the same value. In an implementation, according to the ratio of the height of the first stack ST1 over the height of the second stack ST2 in the vertical direction (Z direction), the first cell lower distance DCD1 may be greater than the second cell lower distance DCD2, and the first cell lower distance DCD1 may be less than the second cell lower distance DCD2.

In an implementation, the first cell upper width WCU1$a$, the second cell upper width WCU2, the first cell lower width WCD1, and the second cell lower width WCD2 may be greater than the first dummy upper width WIU1$a$, the second dummy upper width WIU2, the first dummy lower width WID1, and the second dummy lower width WID2, respectively.

Figure 21:
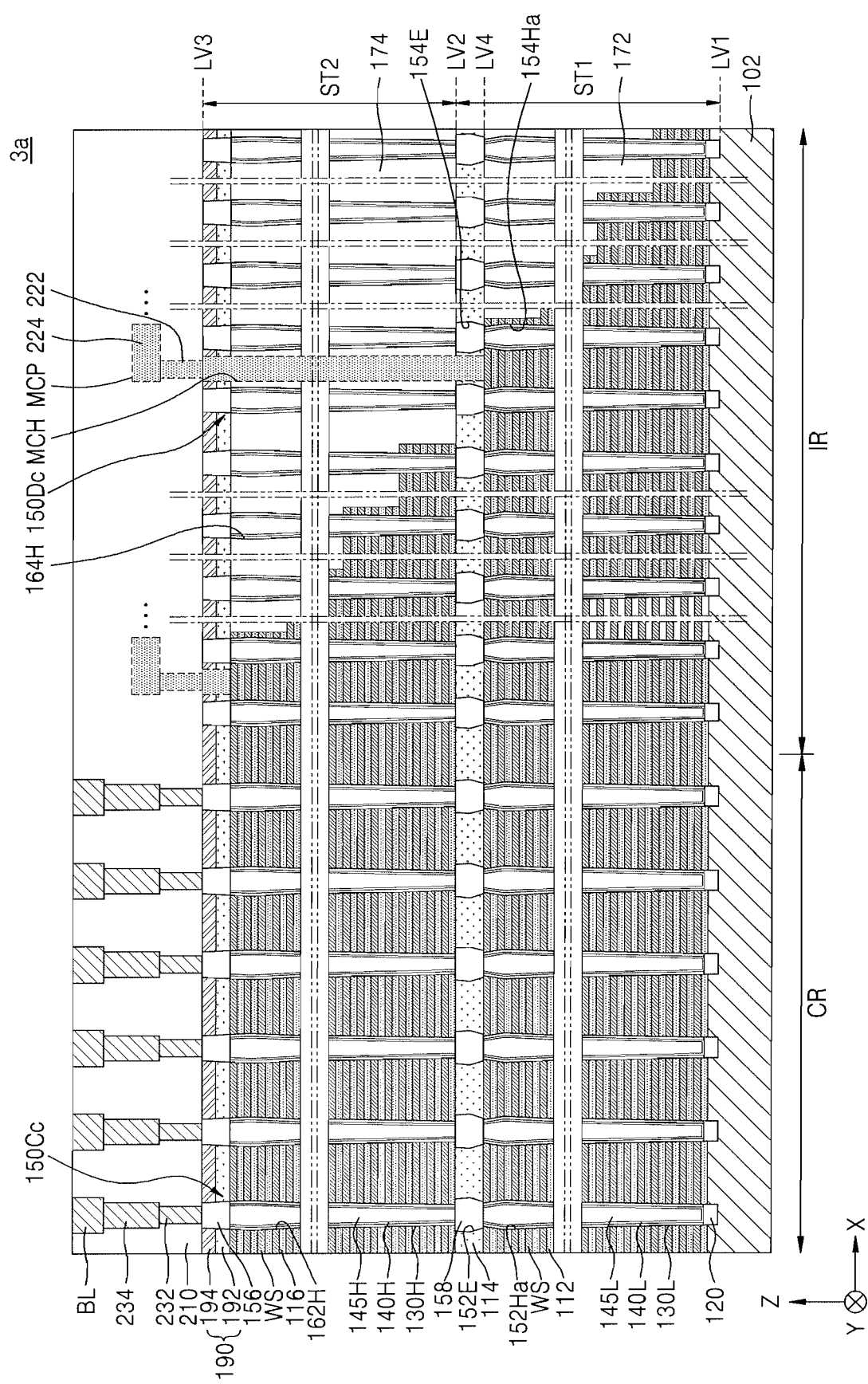
FIG. 21 illustrates a cross-sectional view of an integrated circuit device according to example embodiments.

FIG. 21 illustrates a cross-sectional view of an integrated circuit device according to example embodiments.

Referring to FIG. 21, the integrated circuit device 3a may be generally similar to the integrated circuit device 2a illustrated in FIG. 18, except that the integrated circuit device 3 includes a plurality of cell channel structures 150Cc filling a plurality of dummy channel holes including the first cell channel hole 152Ha and the second cell channel hole 162H that are communicatively connected to each other, instead of the plurality of cell channel structure 150Ca filling the plurality of dummy channel holes including the first cell channel hole 152H and the second cell channel hole 162H that are communicatively connected to each other.

Each of the plurality of cell channel structures 150Cc may be similar to the plurality of cell channel structures 150Ca illustrated in FIG. 18, except that the connection conductive plug layer 158 is formed in the expansion cell hole 152E, and a repeated detailed description thereof may be omitted.

By way of summation and review, a vertical memory device may increase the degree of integration by increasing the number of stacks of memory cells in the vertical direction. As the number of stacks of memory cells in the vertical direction increases in the vertical memory devices, issues could occur in a fabrication process, and electrical reliability of the integrated circuit devices could be degraded.

One or more embodiments may provide an integrated circuit device having excellent electrical characteristics and an increased degree of integration.

One or more embodiments may provide an integrated circuit device including a non-volatile vertical memory device and a fabrication method of the integrated circuit device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
a substrate having a cell region and an interconnection region;
a first stacked structure including a plurality of first insulating layers and a plurality of first word line structures that are alternately stacked one by one on the substrate in the cell region and the interconnection region;
a second stacked structure including a plurality of second insulating layers and a plurality of second word line structures that are alternately stacked one by one on the first stacked structure in the cell region and the interconnection region;
a first protective insulating layer disposed between and in contact with the first stacked structure and the second stacked structure; and
a second protective insulating layer on the second stacked structure,
wherein:
the first stacked structure and the first protective insulating layer have a first cell channel hole penetrating through the first stacked structure and the first protective insulating layer in the cell region, and at least one first dummy channel hole penetrating through the first stacked structure and the first protective insulating layer in the interconnection region,
the second stacked structure and the second protective insulating layer have a second cell channel hole that is communicatively connected to the first cell channel hole in the cell region, and at least one second dummy channel hole communicatively connected to the at least one first dummy channel hole in the interconnection region,
each of the second cell channel hole and the at least one second dummy channel hole penetrating through the second stacked structure and the second protective insulating layer,
a first width of the first cell channel hole at a level of a top surface of the first protective insulating layer is equal to or less than a second width of the first cell channel hole at a level of a bottom surface of the first protective insulating layer, and
a third width of the at least one first dummy channel hole at the level of the top surface of the first protective insulating layer is greater than a fourth width of the at least one first dummy channel hole at the level of the bottom surface of the first protective insulating layer and a ninth width of the at least one first dummy channel hole at the level above the top surface of the first protective insulating layer in which the second stacked structure contacts the first protective insulating layer.

2. The integrated circuit device as claimed in claim 1, wherein a portion of the at least one first dummy channel hole defined by the first protective insulating layer includes an expansion dummy hole having a width greater than other portions of the at least one first dummy channel hole.

3. The integrated circuit device as claimed in claim 1, wherein the second width is greater than a fifth width of a lowermost end of the first cell channel hole.

4. The integrated circuit device as claimed in claim 1, wherein the fourth width is greater than a sixth width of a lowermost end of the at least one first dummy channel hole.

5. The integrated circuit device as claimed in claim 1, wherein the third width is greater than a seventh width of an uppermost end of the at least one second dummy channel hole.

6. The integrated circuit device as claimed in claim 5, wherein the first width is substantially identical to an eighth width of an uppermost end of the second cell channel hole.

7. The integrated circuit device as claimed in claim 1, further comprising at least two conductive contact plugs electrically connected to any one of the plurality of first word line structures and the plurality of second word line structures in the interconnection region.

8. The integrated circuit device as claimed in claim 7, wherein:
the at least one first dummy channel hole includes a plurality of first dummy channel holes;
the at least one second dummy channel hole includes a plurality of second dummy channel holes; and
a distance between uppermost ends of a pair of first dummy channel holes among the plurality of first dummy channel holes adjacent to each other with one conductive contact plug therebetween that are proximate to the cell region among the at least two conductive contact plugs is less than a distance between uppermost ends of another pair of first dummy channel holes among the plurality of first dummy channel holes adjacent to each other with another conductive contact plug therebetween that are distal to the cell region.

9. The integrated circuit device as claimed in claim 8, wherein a distance between uppermost ends of a pair of first dummy channel holes among the plurality of first dummy channel holes adjacent to each other with one conductive contact plug therebetween among the at least two conductive contact plugs is less than a distance between uppermost ends of a pair of second dummy channel holes among the plurality of second dummy channel holes.

10. The integrated circuit device as claimed in claim 8, wherein a distance between lowermost ends of a pair of first dummy channel holes among the plurality of first dummy channel holes adjacent to each other with one conductive contact plug therebetween among the at least two conductive contact plugs is less than a distance between lowermost ends of a pair of second dummy channel holes among the plurality of second dummy channel holes.

11. The integrated circuit device as claimed in claim 1, wherein, in the interconnection region, edge portions of the first stacked structure and the second stacked structure have a stepwise structure.

12. An integrated circuit device, comprising:
a substrate including a cell region and an interconnection region;
a first stacked structure and a second stacked structure on the first stacked structure, the first stacked structure and the second stacked structure each including a plurality of insulating layers and a plurality of word line structures that are alternately stacked one by one on the cell region and the interconnection region;
a protective insulating layer disposed between and in contact with the first stacked structure and the second stacked structure;
a conductive contact plug electrically connected to any one of the plurality of word line structures; and
a first channel hole and a second channel hole spaced apart from each other in a horizontal direction, each of the first channel hole and the second channel hole penetrating through the first stacked structure, the protective insulating layer, and the second stacked structure,
wherein:
a first width of the first channel hole at a level of a top surface of the protective insulating layer is equal to or less than a second width of the first channel hole at a level of a bottom surface of the protective insulating layer, and
a third width of the second channel hole at a level of a top surface of the protective insulating layer is greater than a fourth width of the second channel hole at the level of the bottom surface of the protective insulating layer and a fifth width of the at least one first dummy channel hole at the level above the top surface of the first protective insulating layer in which the second stacked structure contacts the first protective insulating layer.

13. The integrated circuit device as claimed in claim 12, wherein:
the first channel hole is on the cell region,
the second channel hole and the conductive contact plug are on the interconnection region, and
on the interconnection region, edge portions of the first stacked structure and the second stacked structure have a stepwise structure.

14. An integrated circuit device, comprising:
a substrate having a cell region and an interconnection region;
a first stacked structure and a second stacked structure on the first stacked structure, the first stacked structure and the second stacked structure each including a plurality of insulating layers and a plurality of word line structures that are alternately stacked one by one on the cell region and the interconnection region;
a first protective insulating layer disposed between and in contact with the first stacked structure and the second stacked structure;
at least two conductive contact plugs electrically connected to any one of the plurality of word line structures in the interconnection region;
the first stacked structure and the first protective insulating layer have a first cell channel hole penetrating through the first stacked structure and the first protective insulating layer in the cell region, and a first dummy channel hole penetrating through the first stacked structure and the first protective insulating layer in the interconnection region; and
the second stacked structure has a second cell channel hole that is communicatively connected to the first cell channel hole in the cell region, and a second dummy channel hole communicatively connected to the first dummy channel hole in the interconnection region, each of the second cell channel hole and the second dummy channel hole penetrating through the second stacked structure,
wherein:
a first width of an uppermost end of the first cell channel hole is equal to or less than a second width of the first cell channel hole at a level of a bottom surface of the first protective insulating layer,
a third width of an uppermost end of the first dummy channel hole is greater than a fourth width of the first dummy channel hole at the level of the bottom surface of the first protective insulating layer,
a fifth width of a lowermost end of the second cell channel hole is less than the first width,
a sixth width of a lowermost end of the second dummy channel hole is less than the second width, and
a fifth width of a lowermost end of the second cell channel hole is less than the first width, and
a sixth width of a lowermost end of the second dummy channel hole is less than the second width and an eleventh width of the at least one first dummy channel hole at the level above the top surface of the first protective insulating layer in which the second stacked structure contacts the first protective insulating layer.

15. The integrated circuit device as claimed in claim 14, wherein the second width is greater than a seventh width of a lowermost end of the first cell channel hole.

16. The integrated circuit device as claimed in claim 14, wherein the fourth width is greater than an eighth width of a lowermost end of the first dummy channel hole.

17. The integrated circuit device as claimed in claim 14, wherein the third width is greater than a ninth width of an uppermost end of the second dummy channel hole.

18. The integrated circuit device as claimed in claim 17, wherein the first width is substantially identical to a ten width of an uppermost end of the second cell channel hole.

19. The integrated circuit device as claimed in claim 17, wherein the fifth width is less than the ninth width.

20. The integrated circuit device as claimed in claim 14, wherein the fifth width is less than the fourth width.

\* \* \* \* \*